US007750551B2

(12) United States Patent
Kameyama et al.

(10) Patent No.: US 7,750,551 B2
(45) Date of Patent: Jul. 6, 2010

(54) LIGHT EMITTING DEVICE AND METHOD FOR MANUFACTURING THE SAME

(75) Inventors: Shingo Kameyama, Ibaraki (JP); Takenori Goto, Moriguchi (JP); Tatsuya Kunisato, Takatsuki (JP)

(73) Assignee: Sanyo Electric Co., Ltd., Osaka (JP)

( * ) Notice: Subject to any disclaimer, the term of this patent is extended or adjusted under 35 U.S.C. 154(b) by 422 days.

(21) Appl. No.: 11/524,256

(22) Filed: Sep. 21, 2006

(65) Prior Publication Data

US 2007/0069633 A1      Mar. 29, 2007

(30) Foreign Application Priority Data

Sep. 27, 2005  (JP)  ............................. 2005-280321

(51) Int. Cl.
*H01J 1/62*       (2006.01)
(52) U.S. Cl. ...................................... 313/502; 257/200
(58) Field of Classification Search ................. 313/502; 257/200; 357/17
See application file for complete search history.

(56) References Cited

U.S. PATENT DOCUMENTS

| | | | | |
|---|---|---|---|---|
| 5,196,718 | A * | 3/1993 | Sasagawa | ..................... 257/88 |
| 6,791,116 | B2 | 9/2004 | Takahashi et al. | |
| 7,422,504 | B2 * | 9/2008 | Maeda et al. | ................. 445/24 |
| 2003/0038295 | A1 | 2/2003 | Koda | |
| 2003/0214233 | A1 | 11/2003 | Takahashi et al. | |

FOREIGN PATENT DOCUMENTS

| | | |
|---|---|---|
| EP | 1548851 | 6/2005 |
| JP | 2002335010 | 11/2002 |
| JP | 2003-046134 A | 2/2003 |
| JP | 2003101074 | 4/2003 |
| JP | 2003142737 | 5/2003 |
| JP | 2004-111882 A | 4/2004 |
| JP | 2004-349647 A | 12/2004 |
| JP | 2005093896 | 4/2005 |
| JP | 2005093896 A * | 4/2005 |
| JP | 2005142194 | 6/2005 |

OTHER PUBLICATIONS

English Translation of JP2005-093896.*
European Search Report, dated Oct. 15, 2009.
Official Action in corresponding Japanese Application; dated Oct. 27, 2009; English translation included.

* cited by examiner

*Primary Examiner*—Nimeshkumar D. Patel
*Assistant Examiner*—Mary Ellen Bowman
(74) *Attorney, Agent, or Firm*—NDQ&M Watchstone LLP

(57) ABSTRACT

A light emitting device includes a light emitting element mounted on a base; a phosphor-containing transparent resin section which contains a phosphor for absorbing light emitted from the light emitting element and for emitting light having a wavelength different from that of the absorbed light, and which is filled in the base while containing the light emitting element mounted on the base and with the light emitting element covered therewith; and a high-concentration phosphor-containing resin layers, which is formed on a section directly above the light emitting element, and which has a phosphor concentration higher than that of the phosphor-containing transparent resin.

18 Claims, 17 Drawing Sheets

FIG. 6
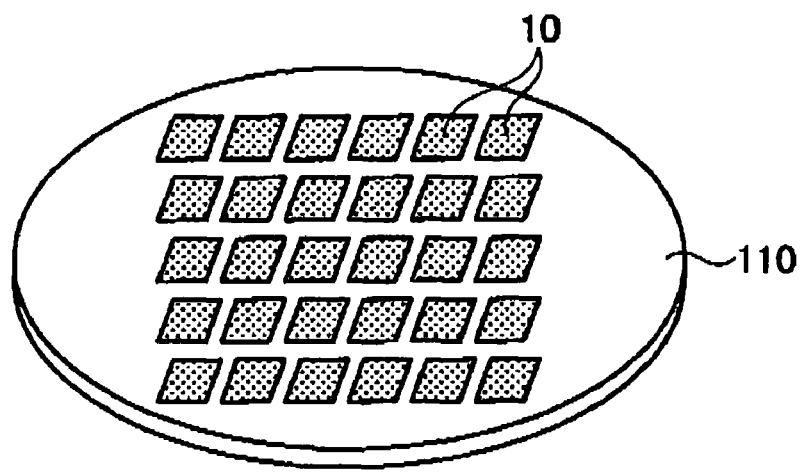
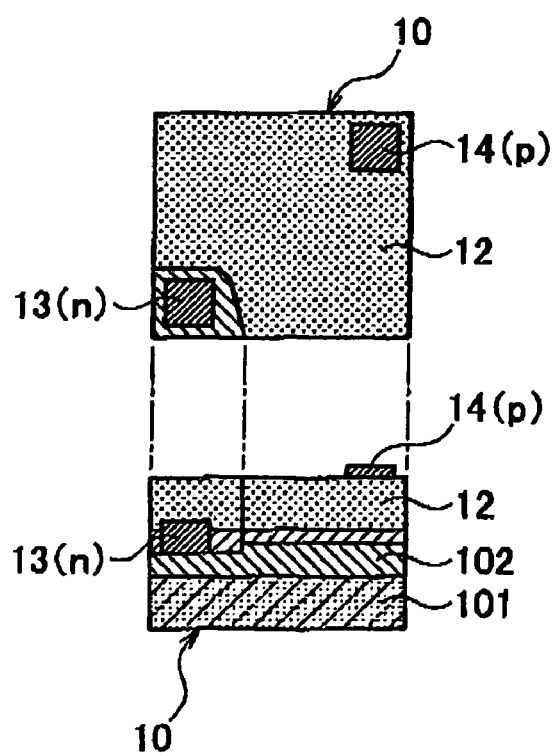
FIG. 7A
FIG. 7B

FIG. 12
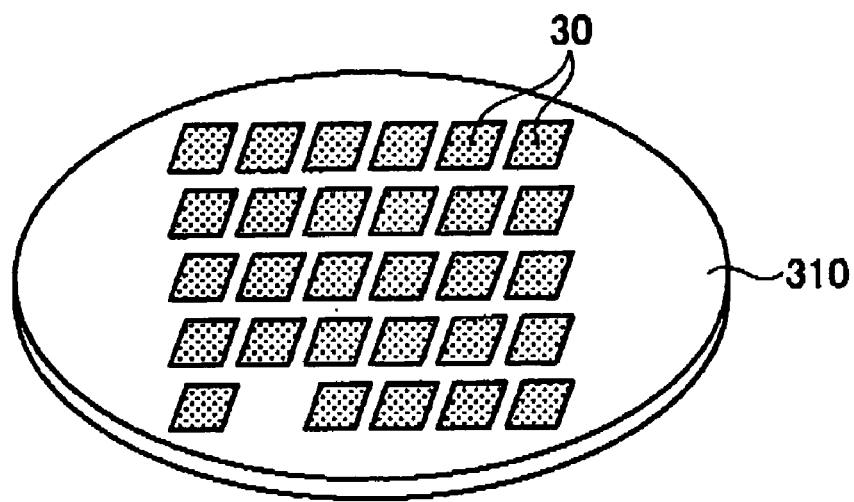
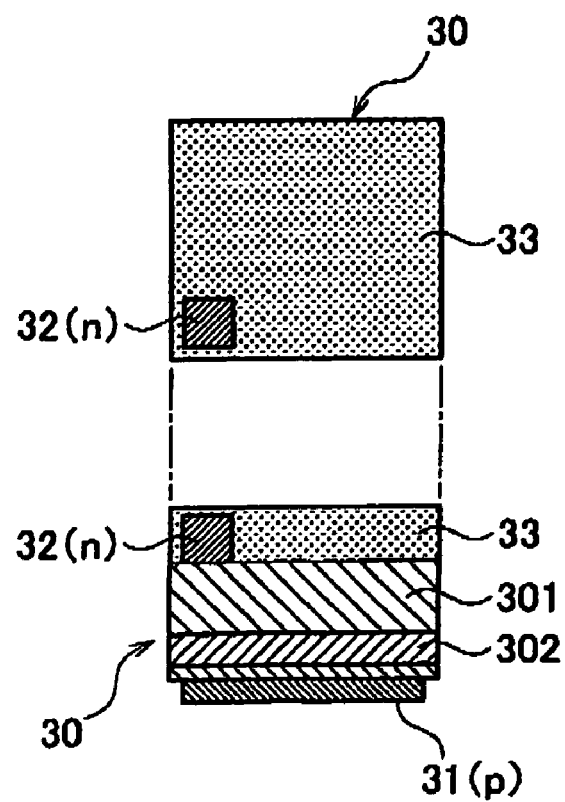
FIG. 13A
FIG. 13B

FIG. 15
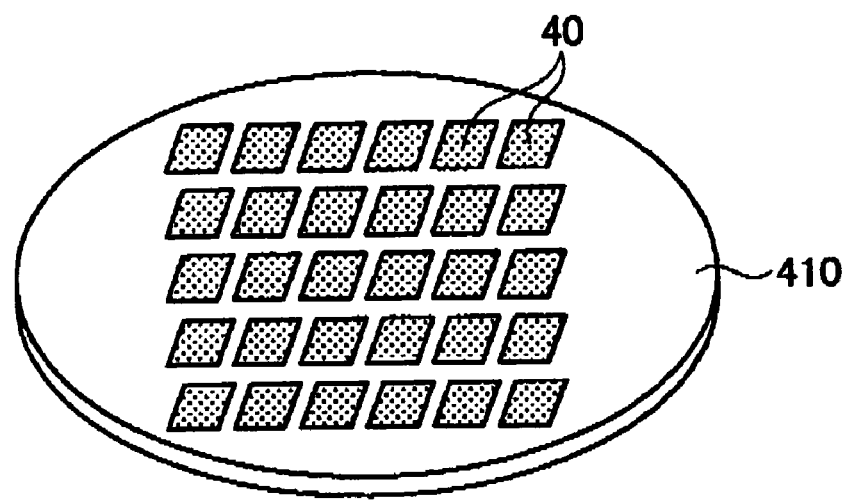
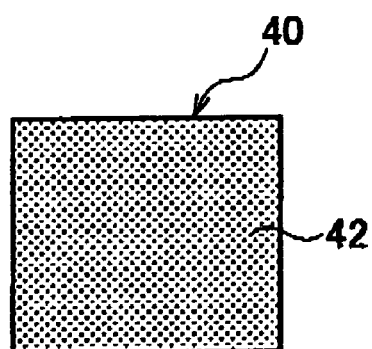
FIG. 16A
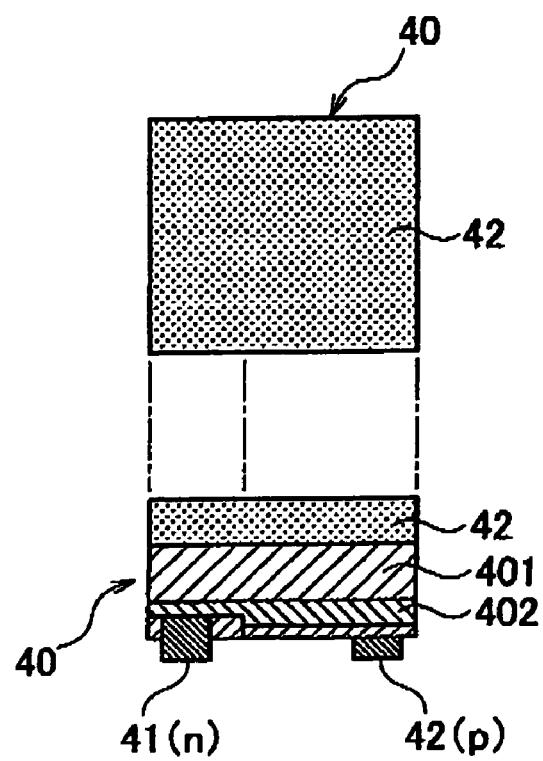
FIG. 16B

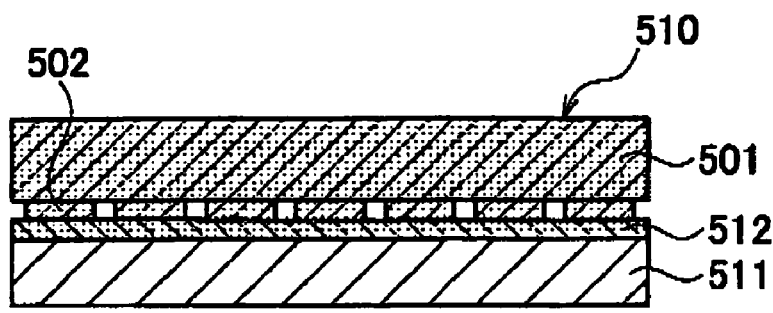
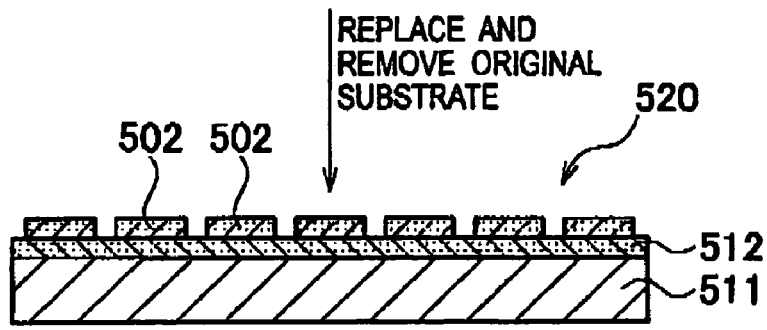
FIG. 20A
FIG. 20B
REPLACE AND REMOVE ORIGINAL SUBSTRATE
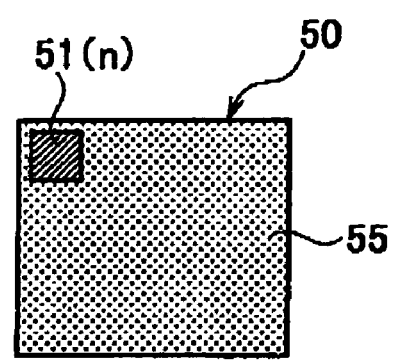
FIG. 21A
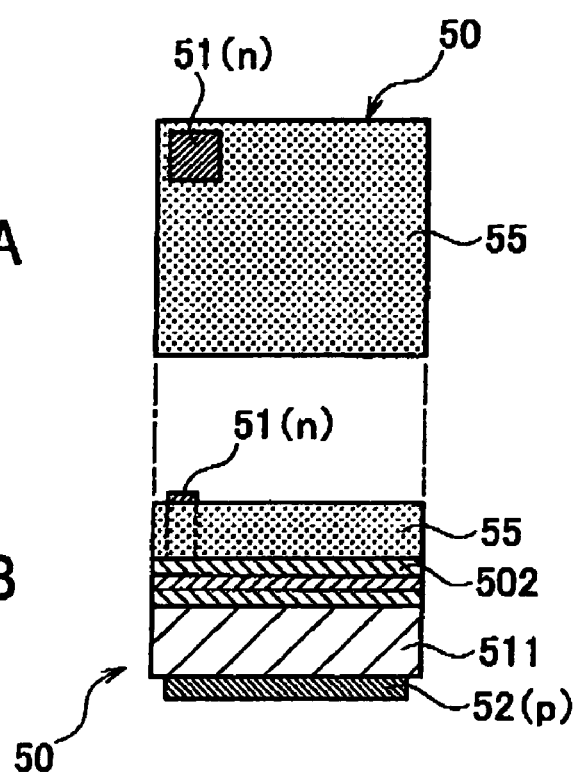
FIG. 21B FIG. 23
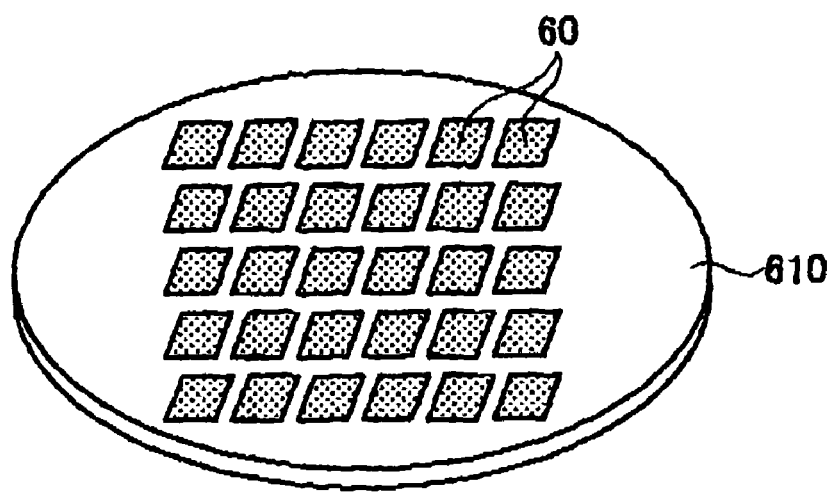
FIG. 24A
FIG. 24B
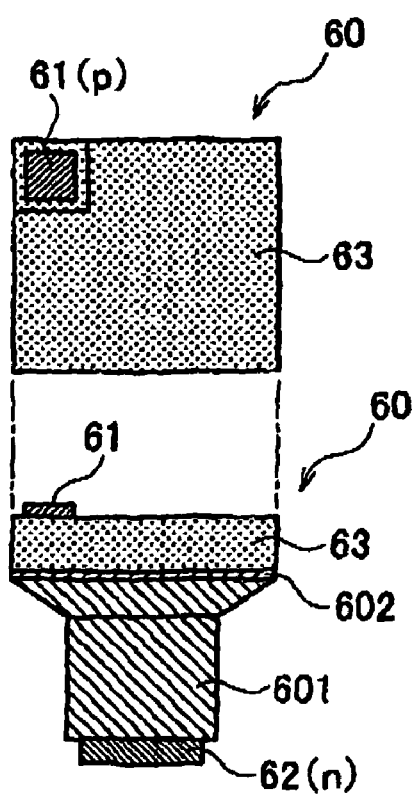

LIGHT EMITTING DEVICE AND METHOD FOR MANUFACTURING THE SAME

CROSS REFERENCE TO RELATED APPLICATIONS

This application is based upon and claims the benefit of priority from prior Japanese Patent Application P2005-280321 filed on Sep. 27, 2005; the entire contents of which are incorporated by reference herein.

BACKGROUND OF THE INVENTION

1. Field of the Invention

The present invention relates to a light emitting device which is provided with a light emitting element and a phosphor, and which is configured to emit light, and a method for manufacturing the light emitting device.

2. Description of the Related Art

A known conventional light emitting device, which is provided with a light emitting element and a phosphor, is configured in the following manner, for example. A lead frame, which is provided with a concave section, is used to mount a light emitting diode (LED), which is the light emitting element, on a bottom surface of the concave section of the lead frame. The phosphor is mixed with a transparent resin, and the concave section is fully filled with this phosphor-containing resin so that the resin covers the LED. The phosphor is designed to absorb light emitted from the LED, and is designed to convert the light into light having a different wavelength. Among light emitting devices of this configuration, there is one in which a blue LED is used as the LED and the phosphor configured to convert wavelength of the light for the blue LED into that for yellow is used, for example. Such a light emitting device enables white light to be emitted on a light emission observation surface by mixing the blue light and the yellow light. Meanwhile, in another light emitting device, a near ultraviolet LED is used as the LED and the phosphor configured to convert wavelength of the light for the near ultraviolet LED into those for three colors of red, green, and blue is used. Such a light emitting device enables white light to be emitted on a light emission observation surface by mixing the colors emitted from the phosphor.

However, in these light emitting devices, depending on the shape of the light emitting element, uneven light emission is caused due to a difference in light intensity of the blue light or the near ultraviolet light emitted from an upper surface side or a side surface side of the light emitting element. For example, as shown in FIG. 1, a light emitting device 800 configured in the following manner will be considered. A light emitting element 80 is mounted in the device, and phosphor-containing transparent resin 81 fills around the device while contacting and covering the device. The light emitting element 80 has a structure in which the light intensity is the highest in a direction directly above the blue LED or the near ultraviolet LED. When the light emitting device 800 is viewed from a light emission observation surface 1, an overhead section 2 of the light emitting element 80, in which the blue LED or the near ultraviolet LED is used, looks blue or violet due to the blue light or the ultraviolet, and a sounding section 3 looks white. Accordingly, this device causes color shading. As shown in FIG. 2, there may also be a case in which the light intensity is the highest in a lateral direction and an obliquely downward direction depending on a shape of a light emitting element 90. Consideration will be given for a light emitting device 900 of a configuration in which such a light emitting element 90 is mounted, and in which phosphor-containing transparent resin 91 fills around the device while contacting and covering the device. In a case where the light emitting device 900 is viewed from a light emission observation surface 1, an overhead section 2 of the light emitting element 90, in which the blue LED or the near ultraviolet LED is used, looks white, and a surrounding section 3 exhibits a color in a blue to ultraviolet zone. Accordingly, this device cause color shading.

As a light emitting device with which such color shading can be eliminated, light emitting devices as disclosed in Japanese Patent Publication No. 2004-111882 (hereinafter referred to as "Patent Document 1") and in Japanese Patent Publication No. 2004-349647 (hereinafter referred to as "Past Document 2") are known. The light emitting device disclosed in Patent Document 1 has a following configuration. After the light emitting element is mounted on the concave section of the lead frame, first phosphor-containing transparent resin having a low phosphor concentration is filled up to a position of an upper surface of the light emitting element. Second phosphor-containing transparent resin having a high phosphor concentration is disposed on the first phosphor-containing resin. A value, which is obtained by multiplying an optical path length reaching an upper surface of the second phosphor-containing transparent resin by the concentration of the phosphor, is maintained to be constant. Thereby, color shading is reduced. On the other hand, in the light emitting device disclosed in Patent Document 2, a phosphor unit is disposed on a plane of an optical member located inside the light emitting device, the plane facing the light emitting element. In addition, in-plane intensity distribution of the phosphor concentration is provided within the plane. Thereby, color shading is reduced.

However, in the light emitting device disclosed in Patent Document 1, there is a case where a position for fixing the light emitting element to a concave section of a base is displaced when the light emitting element is mounted on the concave section of the base. In this case the methods of forming the phosphor-containing resin, which corresponds to the respective conventional techniques described above, likely induce displacement of a layout between the light emitting element and the phosphor-containing resin. A problem, which may occur as a consequence, is that color shading cannot be reduced. Moreover, as in the light emitting device disclosed in Patent Document 2, in a case where the device is configured so that the light emitting element and the phosphor-containing resin are located apart from each other, it is necessary to consider spread of the light emitted from the light emitting element as well. Accordingly, there is a problem that it is technically difficult to control the in-plane intensity distribution for the spreading radiation or for the position to which the light emitting element is fixed.

SUMMARY OF THE INVENTION

The present invention has been made in view of the foregoing technical problems of the prior art. An object of the present invention is to provide a light emitting device with which uniform light emission can be obtained on a light emission observation surface, and to provide a method for manufacturing the light emitting device.

A first aspect of the present invention inheres in a light emitting device which includes a base, a light emitting element, a phosphor-containing transparent resin section, and a high-concentration phosphor-containing resin layer. The light emitting element is disposed on an upper surface of the base so that the light intensity of the light emitting element is higher in a direction perpendicular to the upper surface of the base than in a direction horizontal to the upper surface of the base. The phosphor-containing transparent resin section is provided above the light emitting element while covering an area wider than an upper surface of the light emitting element, and contains the phosphor to which the light emitted from the light emitting element is absorbed, and which emits light having a wavelength different from a wavelength to the absorbed light. The high-concentration phosphor-containing resin layer is formed on an upper surface of the light emitting element, and has a phosphor concentration higher than a phosphor concentration of the phosphor-containing transparent resin section.

In the light emitting device according to the first aspect, light emitted in the perpendicular direction from the light emitting element may be projected to the outside through the high-concentration phosphor-containing resin layer and through the phosphor-containing transparent resin section, and in which light emitted in the parallel direction from the light emitting element may be projected to the outside through the phosphor-containing transparent resin section.

In the light emitting device according to the first aspect, the phosphor-containing transparent resin section may have phosphor concentration in a range of 10 to 15 weight percent, and the high-concentration phosphor-containing resin layer may have phosphor concentration in a range of 20 to 25 weight percent.

A second aspect of the present invention inheres in a light emitting device which includes the base, the light emitting element, the phosphor-containing transparent resin, and a low-concentration phosphor-containing resin layer. The light emitting element is disposed on the upper surface of the base so that the light intensity of the light emitting element is higher in a direction perpendicular to the upper surface of the base than in a direction horizontal to the upper surface of the base. The phosphor-containing transparent resin section is provided above the light emitting element while covering an area wider than an upper surface of the light emitting element, and contains the phosphor, to which the light emitted from the light emitting element is absorbed, and which emits light having a wavelength different from that of the absorbed light. The low-concentration phosphor-containing resin layer is formed on the upper surface of the light emitting element, and has a phosphor concentration lower than a phosphor concentration of the phosphor-containing transparent resin section.

In the light emitting device according to the second aspect, light emitted in the perpendicular direction from the light emitting element may be projected to the outside through the low-concentration phosphor-containing resin layer, and in which light emitted in the parallel direction from the light emitting element may be projected to the outside through the phosphor-containing transparent resin section.

In the light emitting device according to the second aspect, the phosphor-containing transparent resin section may have phosphor concentration in a range of 20 to 25 weight percent, and the low-concentration phosphor-containing resin layer may have phosphor concentration in a range of 10 to 15 weight percent.

In the light emitting device of any one of the first and second aspects, the light emitting element may emit any one of blue light and ultraviolet light.

A third aspect of the present invention inheres in a method for manufacturing a light emitting device, which includes: forming, on a surface of the light emitting element, a phosphor-containing resin layer containing a phosphor which absorbs light emitted from the light emitting element, and which emits light having a wavelength different from a wavelength of the absorbed light, the light emitting element being disposed on a surface of the substrate and being provided with a light emitting layer, the surface of the light emitting element facing the surface of the substrate; placing the surface of the phosphor-containing resin layer up, and disposing the light emitting element onto an upper surface of a base so that light intensity in a direction perpendicular to the upper surface of the base is higher than that in a direction parallel to the upper surface of the base; and forming a phosphor-containing transparent resin section, which has a phosphor concentration lower than a phosphor concentration of the phosphor-containing resin layer, above the light emitting element while covering an area wider than the surface of the light emitting element where the phosphor-containing resin layer is formed.

A fourth aspect of the present invention inheres in a method for manufacturing a light emitting device, which includes: forming, on a surface of the light emitting element, a phosphor-containing resin layer containing a phosphor which absorbs light emitted from the light emitting element, and which emits light having a wavelength different from a wavelength of the absorbed light, the light emitting element being disposed on a surface of the substrate and being provided with a light emitting layer, the surface of the light emitting element facing the surface of the substrate; placing the surface of the phosphor-containing layer up, an disposing the light emitting element onto the upper surface of the base so that light intensity in a direction parallel to the upper surface of the base is higher than that in a direction perpendicular to the upper of the base; and forming a phosphor-containing transparent resin section, which has a phosphor concentration higher than a phosphor concentration of the phosphor-containing resin layer with surroundings of the light emitting element covered therewith.

In the method according to the fourth aspect, the phosphor-containing transparent section may be formed without covering an upper part of the phosphor-containing resin layer therewith.

According to the present invention, a light emitting device, which is configured in the following manner, and a manufacturing method thereof can be provided. A light emitting element is disposed on the upper surface of the base so that light intensity in a direction perpendicular to the upper surface of the base is higher than that in a direction horizontal to the upper surface of the base. A phosphor-containing transparent resin section containing a phosphor is provided above the light emitting element while covering an area wider than an upper surface of the light emitting element, absorbs light emitted from the light emitting element, and emits light having a wavelength different from that of the absorbed light. A high-concentration phosphor-containing resin layer has a phosphor concentration higher than that of the phosphor-containing transparent resin section. Thus, phosphor-containing transparent resin, which has a conventional concentration, is adapted as the low-concentration phosphor-containing transparent resin section, and phosphor-containing transparent resin, which has a higher phosphor concentration, is adapted as the high-concentration phosphor-containing resin layer on the upper surface of the light emitting element. Thereby, wavelength of the light, which is radiated from the light emitting element toward the upper surface can be converted effectively by use of the transparent resin layer having the higher phosphor concentration. Moreover, it is made possible to radiate light, which has the wavelength substantially equivalent to the wavelength converted by use of the low-concentration phosphor-containing section around the light emitting element. Accordingly, it is made possible to provide the light emitting device, which has fine in-plane uniformity, and in which color shading of emitted lift is reduced.

In addition, according to the present invention, a light emitting device, which is configured in the following manner, and a manufacturing method thereof can be provided. A light emitting element is disposed on the upper surface of the base so that light intensity in a direction horizontal to the upper surface of the base is higher than that in a direction perpendicular to the upper surface of the base. A phosphor-containing transparent resin section containing a phosphor is provided on the upper surface of the light emitting element while covering surroundings of the light emitting element, absorbs light emitted from the light emitting element, and emits light having a wavelength different from that of the absorbed light. A low-concentration phosphor-containing resin layer has a phosphor concentration lower than that of the phosphor-containing transparent resin section. Accordingly, phosphor-containing transparent resin, which has a conventional concentration, is adapted as the low-concentration phosphor-containing resin layer on the upper surface of the light emitting element, and resin, which has a phosphor concentration higher than that of the above conventional concentration, is adopted as the phosphor-containing transparent resin section covering the surroundings of the light emitting element. Thereby, wavelength of the light, which is radiated from the light emitting element in the parallel direction, can be converted effectively by use of the phosphor-containing transparent resin section having the higher phosphor concentration. Moreover, it is made possible to radiate light, which has the wavelength substantially equivalent to the wavelength converted by use of the low-concentration phosphor-containing resin layer on the upper surface of the light emitting element. Accordingly, it is made possible to provide the light emitting device, which has fine in-plane uniformity, and in which color shading of the emitted light is reduced on the optical observation surface.

Moreover, according to the present invention, any one of the high-concentration phosphor-containing resin layer and the low-concentration phosphor-containing resin layer are formed on the upper surface of the light emitting element. The phosphor-containing transparent resin section is formed while covering either the upper surface, or the surroundings, of the light emitting element. Hence, positional relations are intact respectively between the light emitting element and the high-concentration phosphor-containing resin layer and between the light emitting element and the low-concentration phosphor-containing resin layer. Furthermore, positional relations are also intact respectively between the high-concentration phosphor-containing resin layer and the phosphor-containing transparent resin section, between the low-concentration phosphor-containing resin layer and the phosphor-containing transparent resin section, and between the phosphor-containing transparent resin section and the light emitting element. As a result, the present invention can provide a light emitting device with reduced color shading at a high yield.

BRIEF DESCRIPTION OF THE DRAWINGS

FIG. 6 is a perspective view of the wafer after forming a high-concentration phosphor-containing resins layer in the light emitting element to be mounted on the light emitting device according to the first embodiment.

FIG. 7A is a plan view, and FIG. 7B is a cross-sectional view, of the light emitting element to be mounted on the light emitting device according to the first embodiment.

FIG. 12 is a perspective view of a wafer after forming a high-concentration phosphor-containing resin layer on a light emitting element to be mounted on the light emitting device according to the third embodiment.

FIG. 13A is a plan view, and FIG. 13B is a cross-sectional view, of the light emitting element to be mounted on the light emitting device of the third embodiment.

FIG. 15 is a perspective view of a wafer after forming a high-concentration phosphor-containing resin layer on a light emitting element to be mounted on the light emitting device according to the fourth embodiment.

FIG. 16A is a plan view, and FIG. 16B is a cross-sectional view, of the light emitting element to be mounted on the light emitting device of the fourth embodiment.

FIGS. 20A and 20B are respectively cross-sectional views of the wafer in a process of replacing a substrate in a method for manufacturing the light emitting device according to the fifth embodiment, FIG. 20A being the view before replacing the substrate, and FIG. 20B being the view after replacing the substrate.

FIG. 21A is a plan view, and FIG. 21B is a cross-sectional view, of the light emitting element to be mounted on the light emitting device according to the fifth embodiment.

FIG. 23 is a perspective view of a wafer after forming a high-concentration phosphor-containing resin layer on a light emitting element to be mounted on the light emitting device according to the sixth embodiment.

FIG. 24A is a plan view, and FIG. 24B is a cross-sectional view, of the light emitting element to be mounted on the light emitting device according to the sixth embodiment.

DETAILED DESCRIPTION OF THE INVENTION

Figure 1:
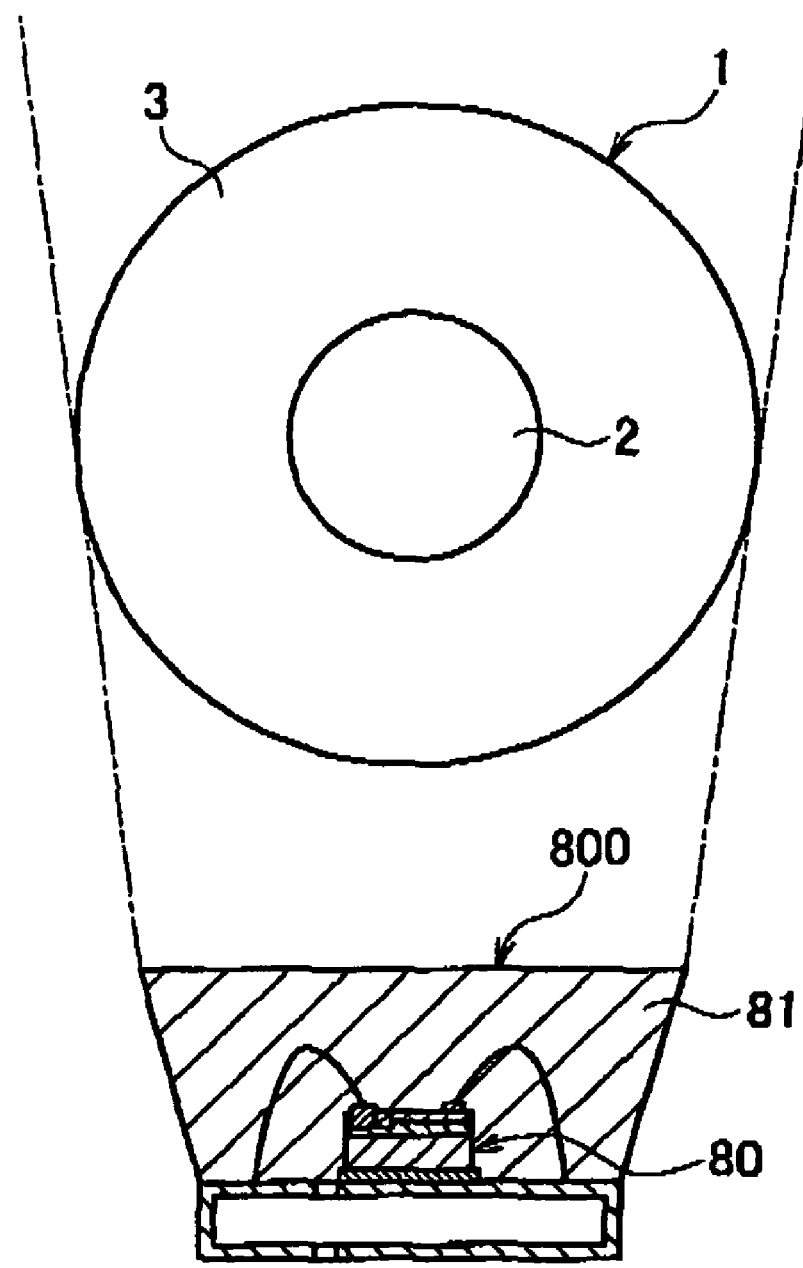
FIG. 1 is a cross-sectional view of a light emitting device of a related example, FIG. 1 serving as an explanatory drawing for a light emission characteristic of the light emitting device.
Figure 2:
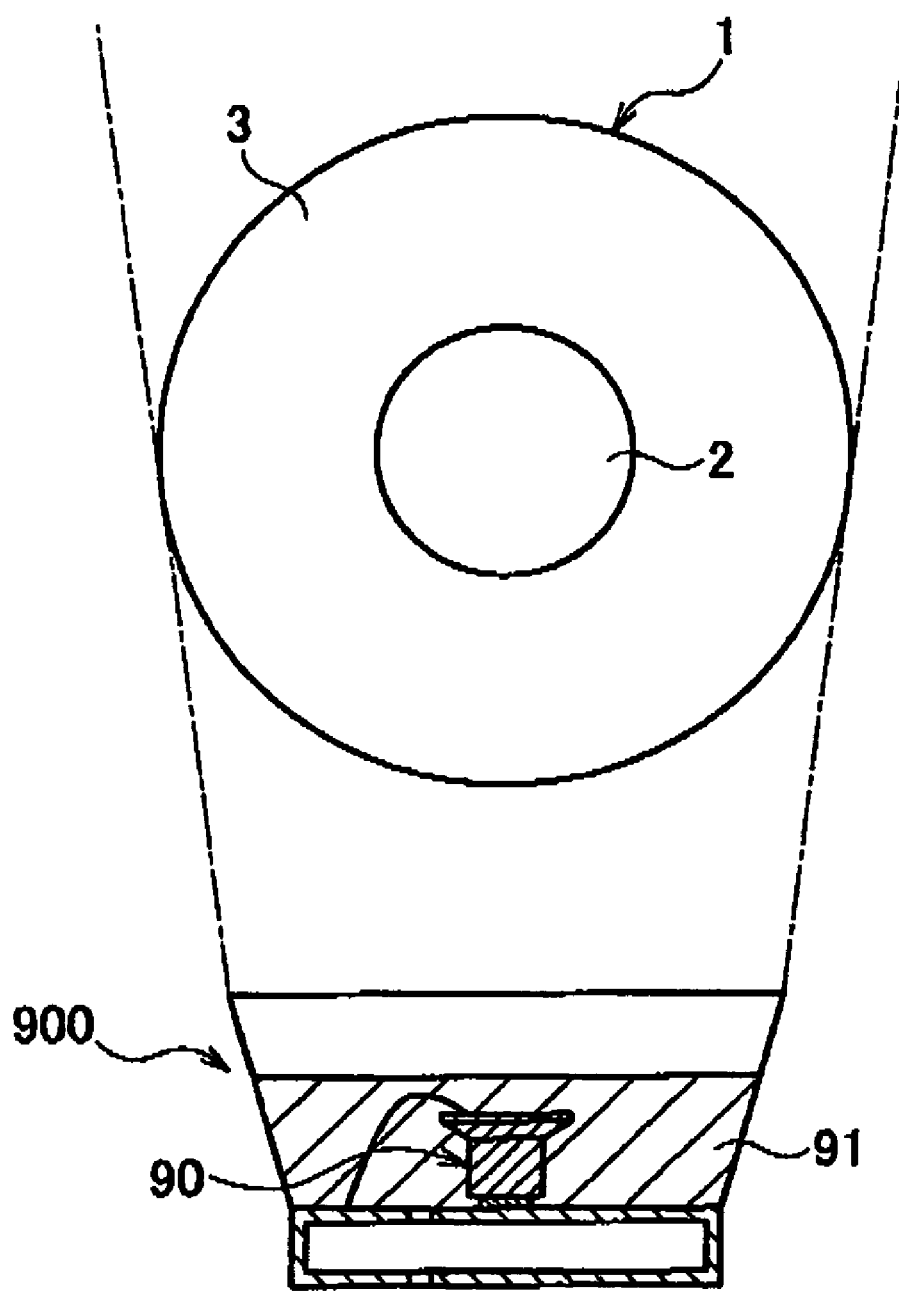
FIG. 2 is a cross-sectional view of a light emitting device of another related example, FIG. 2 serving as an explanatory drawing for a light emission characteristic of the light emitting device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 3:
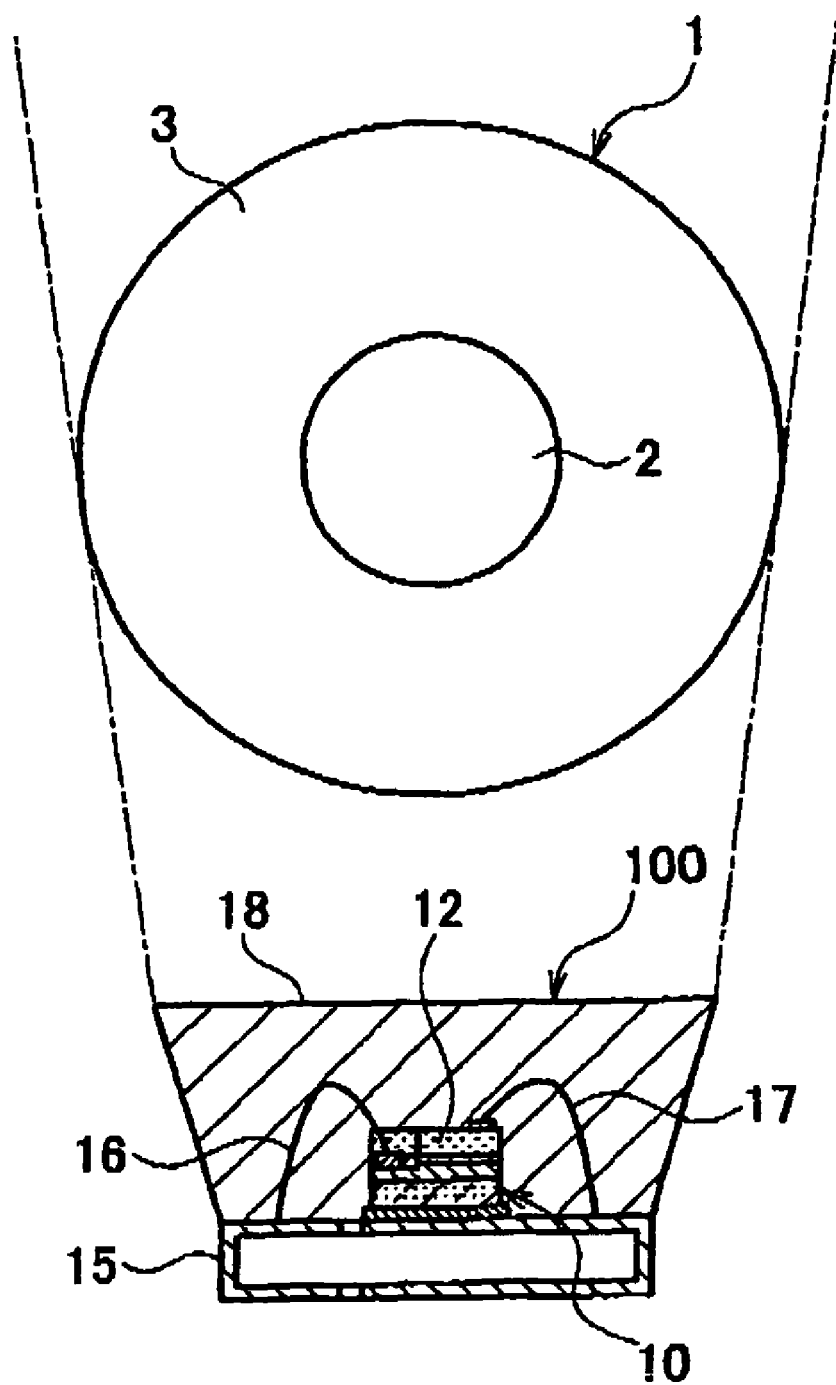
FIG. 3 is a cross-sectional view of a light emitting device according to a first embodiment of the present invention, FIG. 3 serving as an explanatory drawing for a light emission characteristic of the light emitting device.

FIG. 3 shows a light emitting device 100 according to a first embodiment of the present invention, and FIGS. 7A and 7B each shows a light emitting diode (LED) light emitting element 10 to be mounted thereon. The LED light emitting element 10 has a configuration in which a crystal growth layer 102 is formed on a surface of a sapphire crystal substrate 101, and in which a negative (n) electrode 13 and a positive (p) electrode 14 are respectively formed in appropriate positions. The crystal growth layer 102 is a gallium nitride based material, and includes a light emitting layer. A high-concentration phosphor-containing resin layer 12 is formed on an upper surface of the crystal growth layer 102. The high-concentration phosphor-containing resin layer 12 is made of transparent resin containing a high concentration of a phosphor (hereinafter referred to as "first phosphor-containing resin").

The light emitting element 10 is mounted, in the form of a junction-up type, on an upper surface of a concave section of a base 15 in which a side, where the crystal growth layer 102 is formed, is placed up. Thus, in the first embodiment, the LED light emitting element 10 is disposed such that light intensity in a direction perpendicular to the upper surface of the base 15 is higher than that in a direction parallel to the upper surface of the base 15.

The light emitting device 100 has a following configuration. The light emitting element 10 is disposed n the upper surface of the concave section of the base 15. By means of bonding, wires 16 and 17 are respectively connected to the n electrode 13 and the p electrode 14, and a feed pattern (not shown) is connected to each of the wires 16 and 17. A low-concentration phosphor-containing resin section 18, which covers the entire light emitting element 10, is formed by filling the concave section of the base 15 with transparent resin containing a concentration of the phosphor lower than that of the first phosphor-containing resin (hereinafter referred to as "second phosphor-containing resin").

The phosphor concentration of the second phosphor-containing resin having a lower phosphor concentration is substantially equivalent to that of phosphor-containing transparent resin which has been conventionally applied to a LED light emitting element of a similar type. For example, the concentration is set in a range of 10 to 15 w %. As described later, the phosphor concentration of the first phosphor-containing resin, which has a higher concentration, is adjusted to an appropriate concentration for achieving in-plane uniformity of emitted colors on a light emission observation surface 1 of the light emitting device 100, e.g., in a range of 20 to 25 w %.

Figure 4:
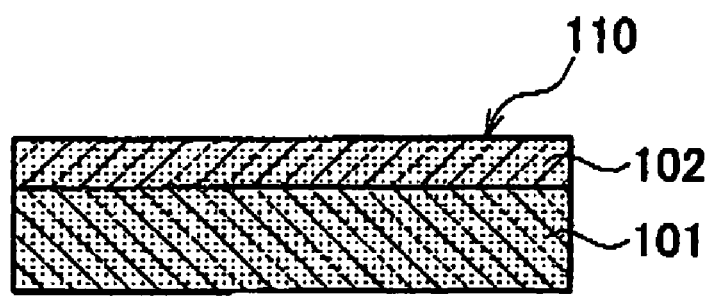
FIG. 4 is a cross-sectional view of a semiconductor wafer used for fabricating a light emitting element to be mounted on the light emitting device according to the first embodiment.
Figure 5:
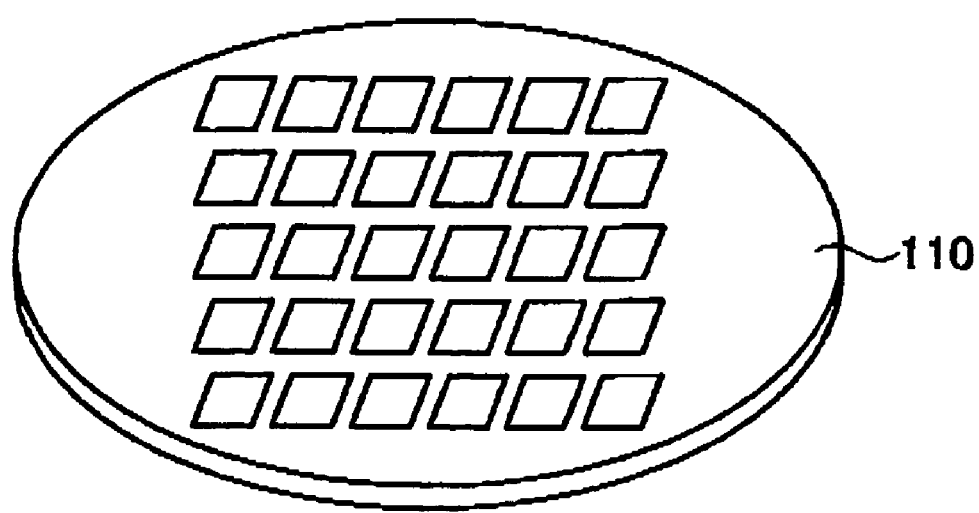
FIG. 5 is a perspective view of the wafer after process of fabricating the light emitting element to be mounted on the light emitting device according to the first embodiment.

Next descriptions will be provided for a method for manufacturing the light emitting device 100 having the above-described configuration. First, as shown in FIG. 4, semiconductor crystal growth layer 102 of the gallium nitride based material is formed, as the LED light emitting element 10, on the crystal substrate 101 made of a sapphire substrate. A crystal growth wafer 110 for blue or near ultraviolet LEDs is fabricated. A fabrication process, such as a process of fabricating an electrode, is performed to form LED structures. After the fabrication process, the respective LED structures are formed on the wafer 110, as shown in FIG. 5. Subsequently, as shown in FIG. 6, by use of a method such as dispensing, screen printing or dot printing, transparent resin is coated on a surface facing a surface of the crystal growth wafer 110, the surface being that of the semiconductor crystal growth layer 102 in the first embodiment. The above transparent resin is the first phosphor-containing resin in the first embodiment, and contains a higher concentration of a phosphor than that of a usual case. The high-concentration phosphor-containing resin layer 12 is formed by thermosetting or photo curing the above transparent resin.

The light emitting element 10 adopted in the first embodiment is a light emitting diode of a junction-up mounting type, and uses the insulating substrate 101 made of the sapphire substrate. Accordingly, as shown in FIGS. 7A and 7B, both of the n electrode 13 and p electrode 14 are formed on the surface where the high-concentration phosphor-containing resin layer 12 is formed. For this reason, when forming the high-concentration phosphor-containing resin layer 12, in which the phosphor concentration thereof is adjusted to the high concentration of 20 to 25 w %, on the surface of the semiconductor crystal growth layer 102, the high-concentration phosphor-containing resin layer 12 is formed so that the high-concentration phosphor-containing resin layer 12 is not formed in the regions corresponding to the respective electrodes 13 and 14. The high-concentration phosphor-containing resin layer 12 is formed by coating the uncured first phosphor-containing resin by use of the method such as dispensing, screen printing or dot printing, and then by thermosetting or photocuring the resin. Thereafter, the crystal growth wafer 110 is cut out in to desired dimensions by scribing, dicing or the like, and is thereby split into individual chips respectively constituting the light emitting elements 10. Each side of an L chip has a length of 0.35 mm, for example.

Next, as shown in FIG. 3, each of the light emitting elements 10, which is split into a chip, is mounted and fixed, in the form of the junction-up type, on the surface of the concave section of the base 15 with a conductive adhesive such as Ag paste while placing the crystal growth layer 102 up, by means of bonding, electric conductivity is achieved with the gold wires 16 and 17. The concave section of the base 15 is filled with the second phosphor containing resin by dispensing, and is treated with thermosetting. The low-concentration phosphor-containing resin section 18 is formed. The second phosphor-containing resin has a phosphor concentration of 10 to 15 w %, which is lower than that of the high-concentration phosphor-containing resin layer 12 formed on the surface of the semiconductor crystal growth layer 102. Accordingly, the light emitting device 100 is obtained.

As shown in FIG. 3, when the light emitting device 100 thus manufactured is energized to be caused to emit light, color shading of the emitted light is reduced on the light emission observation surface 1, and the in-plane uniformity is improved. Specifically, as shown in FIG. 3, in the light emitting device 100 of the first embodiment, light, which has high light intensity, and which is emitted from the light emitting element 10 in a direction perpendicular to the upper surface of the base 15, is projected to the outside through the high-concentration phosphor-containing resin layer 12. On the other hand, light, which has low light intensity, and which is emitted from the light emitting element 10 in a direction parallel to the upper surface of the base 15, is projected to the outside through the low-concentration phosphor-containing resin section 18. Hence, the light, which has the high light intensity, and which is emitted from the light emitting element 10 in the direction perpendicular to the upper surface of the base 15, is converted effectively into light having a different wavelength by the phosphor in the high-concentration phosphor-containing resin layer 12. Consequently, as compared to the conventional case, in which the central section 2 of the light emission observation surface 1 is heavily tinted by a blue to a near ultraviolet color, and in which the peripheral section 3 exhibits a white color, as shown in FIG. 1, the light emitting device 100 of the first embodiment causes the white color in the central section 2 as well. In this way, it is made possible to reduce color shading of the emitted light between the central section 2 and the peripheral section 3, and thereby to improve the in-plane uniformity.

In the first embodiment, the high-concentration phosphor-containing resin layer 12 is formed directly on the surface of the crystal growth layer 102. Accordingly, a positional relation is intact between the high-concentration phosphor-containing resin layer 12 and the light emitting element 10. Furthermore, the low-concentration phosphor-containing resin section 18 is formed while covering the light emitting element 10 on which the high-concentration phosphor-containing resin layer 12 is formed. Thereby, positional relations are also intact respectively between the low-concentration phosphor-containing resin section 18 and the high-concentration phosphor-containing resin layer 12 and between the low-concentration phosphor-containing resin section 18 and the light emitting element 10. It is made possible to obtain the light emitting device with which the color shading of the emitted light is reduced, and with which the in-plane uniformity of the emitted colors is improved, at a high yield.

Note that the structure of the light emitting device 100 of the first embodiment makes it possible to reduce color shading on the light emission observation surface, and to improve the in-plane uniformity irrespective of the shape of the light emitting device such as a round type or a surface mount type.

Second Embodiment

Figure 8:
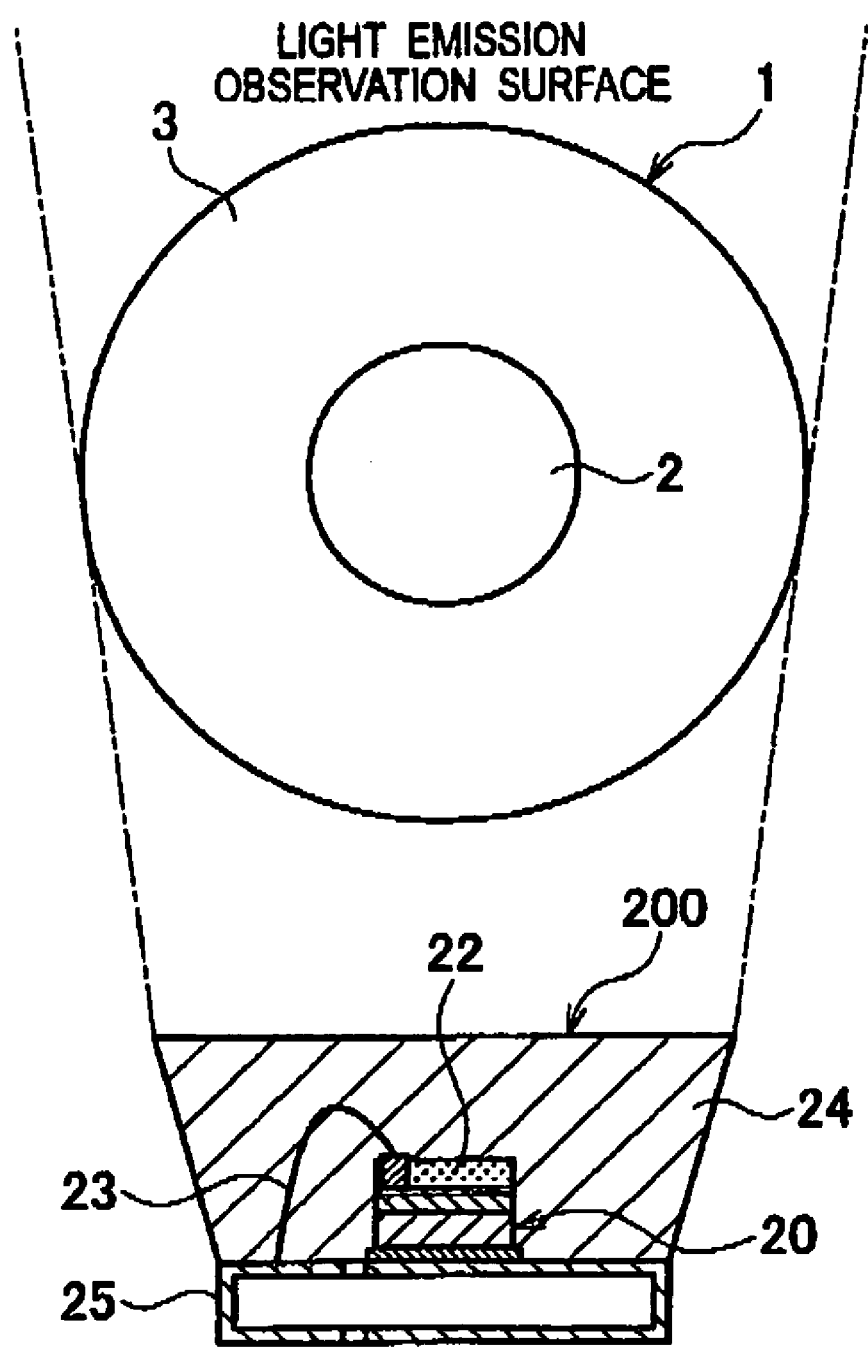
FIG. 8 is a cross-sectional view of a light emitting device according to a second embodiment of the present invention, FIG. 8 serving as an explanatory drawing for a light emission characteristic of the light emitting device.
Figure 10A:
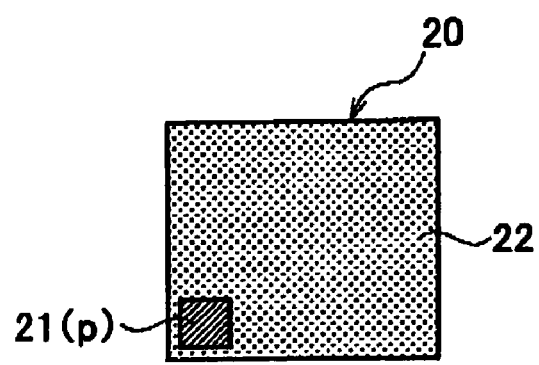
FIG. 10A is a plan view.
Figure 10B:
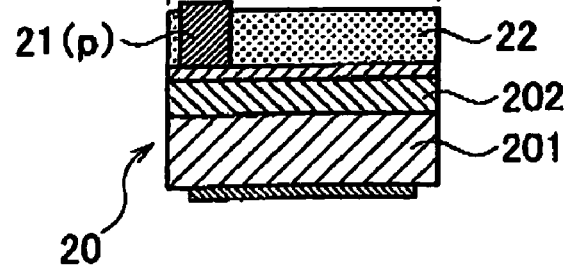
FIG. 10B is a cross-sectional view, of the light emitting element to be mounted on the light emitting device according to the second embodiment.

FIG. 8 shows a light emitting device 200 according to a second embodiment of the present invention, and FIGS. 10A and 10B each show a LED light emitting element 20 to be mounted thereon. The LED light emitting element 20 according to the second embodiment is a light emitting element configured to have light intensity in the perpendicular direction higher than that in the parallel direction. The LED light emitting element 20 includes a crystal growth layer 202 of a gallium nitride based material, a p electrode 21, and an n electrode. The crystal growth layer 202 includes a light emitting layer formed on a surface of a conductive substrate 201 such as a GaN substrate. The p electrode 21 is formed in an appropriate position on a surface of the crystal growth layer 202. The n electrode is formed in an appropriate position on a back surface of the conductive substrate 201. A high-concentration phosphor-containing resin layer 22, which is made of the first phosphor-containing resin having the high concentrations of the phosphor, is formed on an upper surface of the crystal growth layer 202. The light emitting element 20 is mounted, in the form of a junction-up type, on an upper surface of a base 25, in which a side where the crystal growth layer 202 is formed is placed up. Hence, in the second embodiment, the light emitting element 20 is disposed such that light intensity in a direction perpendicular to the upper surface of the base 25 is higher than that in a direction parallel to the upper surface of the base 25.

Moreover, the light emitting device 200 has a following configuration. The light emitting element 20 is disposed on an upper surface of the concave section of the base 25. A wire 23 is connected to the p electrode 21 and to a feed pattern (not shown) by bonding. Furthermore, a low-concentration phosphor-containing resin section 24, which covers the entire light emitting element 20, is formed by filling the concave section of the base 25 with the second phosphor-containing resin having the concentration of the phosphor lower than that of the first phosphor-containing resin. Incidentally, the phosphor concentration of the second phosphor-containing resin, which has the lower phosphor concentration, and the phosphor concentration of the first phosphor-containing resin, which has the high phosphor concentration, are set similar to those in the first embodiment.

Figure 9:
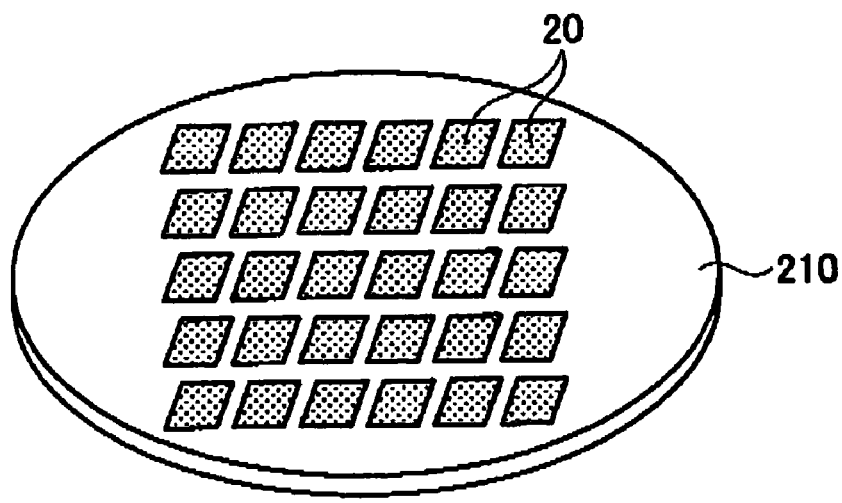
FIG. 9 is a perspective view of a wafer after forming a high-concentration phosphor-containing resin layer on a light emitting element to be mounted on the light emitting device according to the second embodiment.

Next, descriptions will be provided for a method for manufacturing the light emitting device 200 according to the second embodiment having the above-described configuration. As shown in FIG. 9, in the light emitting element 20 using the conductive substrate 201 made of the GaN substrate, the p electrode 21 is formed on a surface where the high-concentration phosphor-containing resin layer 22 made of the first phosphor-containing resin is formed. For this reason, when forming the high-concentration phosphor-containing resin layer 22, in which the phosphor concentration thereof is adjusted to the high concentration from 20 to 25 wt %, on the surface of the crystal growth layer 202, the high-concentration phosphor-containing resin layer 22 is formed so that the high-concentration phosphor-containing resin layer 22 is not formed in the region corresponding to the p electrode 21. The high concentration phosphor-containing resin layer 22 is formed by coating the first phosphor-containing resin by use of the method such as dispensing, screen printing or dot printing, and then by thermosetting or photocuring the resin. Thereafter, the crystal growth wafer 210 is cut out into desired dimensions, such as 0.35 mm on a side, by scribing, dicing or the like, and is thereby split into individual chips respectively constituting the light emitting elements 20.

Subsequently, as shown in FIG. 8, each of the light emitting element 20, which is split into a chip, is mounted and fixed, in the form of the junction-up type, on the concave section of the base 25 with a conductive adhesive such as Ag paste while placing the crystal growth layer 202 up, by means of bonding, electric conductivity is achieved with the gold wire 23. Subsequently, the concave section of the base 25 is filled with the second phosphor containing resin by dispensing, and is treated with thermosetting. The low-concentration phosphor-containing resin section 24 is formed. The second phosphor-containing resin contains a phosphor concentration lower than that of the high-concentration phosphor-containing resin layer 22, which is formed on the surface of the semiconductor crystal growth layer 202. Accordingly, the light emitting device 200 is obtained.

When the light emitting device 200 thus manufactured is energized to emit light, color shading of the emitted light between the central section 2 and the peripheral section 3 is reduced on the light emission observation surface 1, shown in FIG. 8, and the in-plane uniformity is improved as in the case of the first embodiment. In the second embodiment, the high-concentration phosphor-containing resin layer 22 is formed directly on the surface of the crystal growth layer 202. Accordingly, a positional relation is intact between the high-concentration phosphor-containing resin layer 22 and the light emitting element 20. The low-concentration phosphor-containing resin section 24 is formed while covering the light emitting element 20 on which the high-concentration phosphor-containing resin layer 22 is formed. Hence, positional relations are also intact respectively between the low-concentration phosphor-containing resin section 24 and the high-concentration phosphor-containing resin layer 22 and between the low-concentration phosphor-containing resin section 24 and the light emitting element 20. It is made possible to obtain the light emitting device 200 with which the color shading of the emitted light is reduced, and with which the in-plane uniformity of the emitted colors is improved, at a high yield.

Note that the light emitting device 200 of the second embodiment also makes it possible to reduce color shading on the light emission observation surface, and to improve the in-plane uniformity irrespective of the shape of the light emitting device such as the round type or the surface mount type.

Third Embodiment

Figure 11:
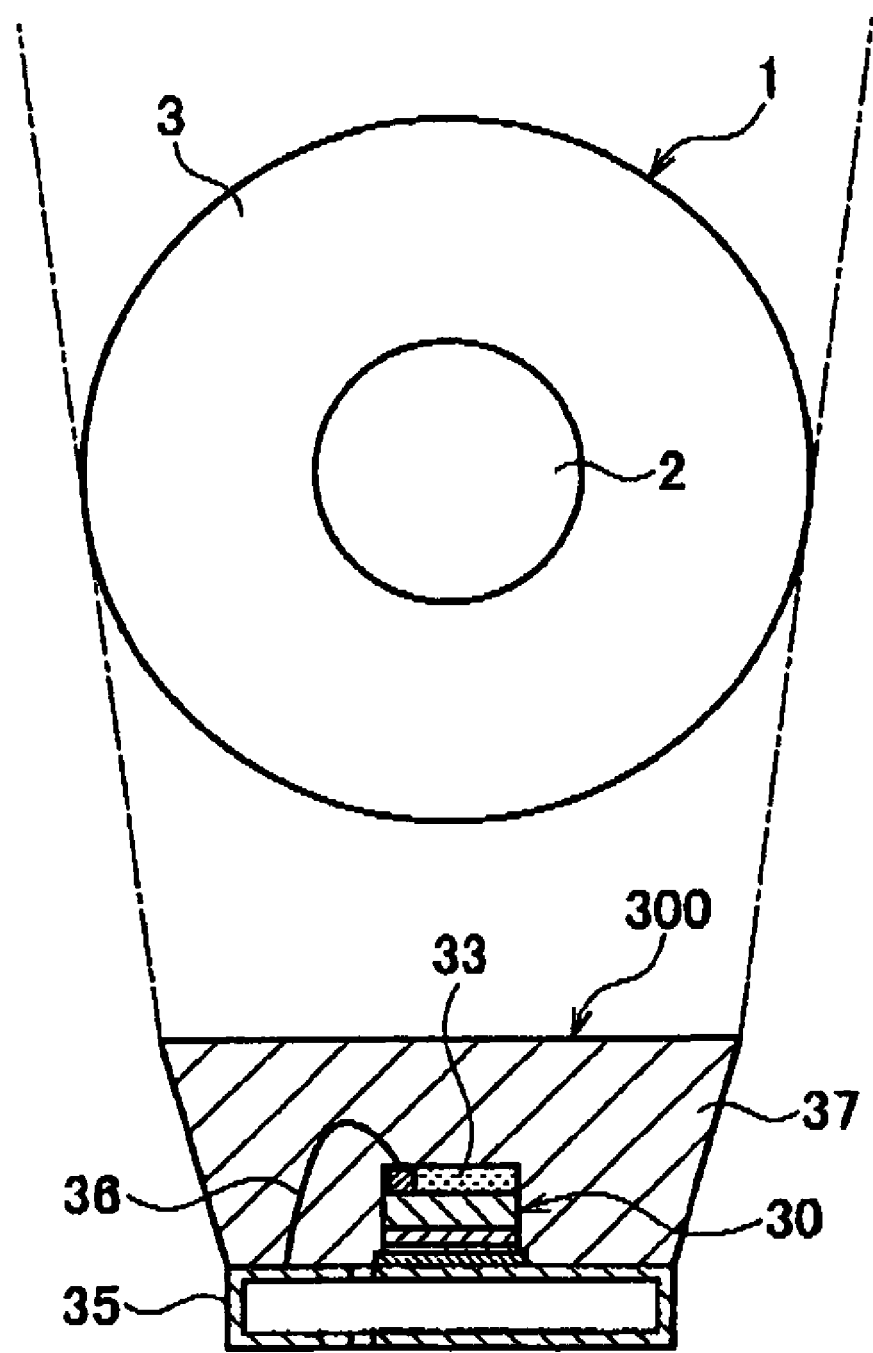
FIG. 11 is a cross-sectional view of a light emitting device according to a third embodiment of the present invention, FIG. 11 serving as an explanatory drawing for a light emission characteristic of the light emitting device.

FIG. 11 shows a light emitting device 300 according to a third embodiment of the present invention, and FIGS. 13A and 13B each show a light emitting element 30 to be mounted thereon. In the light emitting device 300 according to the third embodiment, the light emitting element 30 is mounted and disposed in the form of a junction-down type. As shown in detail in FIGS. 13A and 13B, the LED light emitting element 30 includes a crystal growth layer 302 of a gallium nitride based material, a p electrode 31, and an n electrode 32. The crystal growth layer 302 includes a light emitting layer formed on a surface of a conductive substrate 301 such as a GaN substrate. The p electrode 31 is formed in an appropriate position on a surface of the crystal growth layer 302. The n electrode 32 is formed on a back surface of the conductive substrate 301. A high-concentration phosphor-containing resin layer 33, which is made of the first phosphor-containing resin as similar to those in the first and second embodiments, is formed on the back surface of the conductive substrate 301. The light emitting element 30 is mounted, in the form of the junction-down type, on an upper surface of a base 35, in which the back surface side of the substrate 301 where the high-concentration phosphor-containing resin layer 33 is formed is placed up. Hence, in the third embodiment, the light emitting element 30 is disposed such that light intensity in a direction perpendicular to the upper surface of the base 35 is higher than that in a direction parallel to the upper surface of the base 35.

As shown in detail in FIG. 11, the light emitting device 300 has a following configuration. The light emitting element 30 is disposed on an upper surface of a concave section of the base 35. By means of bonding, a wire 36 is connected to the n electrode 32 and to a feed pattern (not shown). Furthermore, a low-concentration phosphor-containing resin section 37, which covers the entire light emitting element 30, is formed by filling the concave section of the base 35 with the second phosphor-containing resin as similar to that of the first and second embodiments, and by curing the resin.

Next, descriptions will be provided for a method for manufacturing the light emitting device 300 according to the third embodiment having the above-described configuration. As shown in FIGS. 13A and 13B, in the light emitting element 30 using the conductive substrate 301 made of the GaN substrate, the n electrode 32 is formed on the surface where the high-concentration phosphor-containing resin layer 33 made of the first phosphor-containing resin is formed. For this reason, as shown in FIG. 12, when forming the high-concentration phosphor-containing resin layer 33, which has the adjusted phosphor concentration on the back surface of the wafer 310, the high-concentration phosphor-containing resin layer 33 is formed so that the high-concentration phosphor-containing resin layer 33 is not formed in the region corresponding to the p electrode 32. The high concentration phosphor-containing resin layer 33 is formed by coating the second phosphor-containing resin by use of the method such as dispensing, screen printing or dot printing, and then by thermosetting or photocuring the resin. The crystal growth wafer 310 is cut out into desired dimension, such as 0.35 mm on a side, by scribing, dicing or the like, and is thereby split into individual chips respectively constituting the light emitting elements 30.

Next as shown in FIG. 11, each of the light emitting element 30, which is split into a chip, is mounted and fixed, in the form of the junction-down type, on the concave section of the base 35 with a conductive adhesive such as Ag paste while placing the back surface side of the substrate 301 up. By means of bonding, electric conductivity is achieved with the gold wire 36. The concave section of the base 35 is filled with the second phosphor containing resin by dispensing, and is treated with thermosetting. The low-concentration phosphor-containing resin section 37 is formed with the periphery and the upper surface of the light emitting element 30 covered therewith. Accordingly, the light emitting device 300 is obtained.

When the light emitting device 300 thus manufactured is energized to emit light, color shading of the emitted light between the central section 2 and the peripheral section 3 is reduced on the light emission observation surface 1, shown in FIG. 11, and the in-plane uniformity is improved as in the cases of the first and second embodiments. In the third embodiment, the high-concentration phosphor-containing resin layer 33 is formed directly on the back surface of the conductive substrate 301. Accordingly, a positional relation is intact between the high-concentration phosphor-containing resin layer 33 and the light emitting element 30. The low-concentration phosphor-containing resin section 37 is formed while converting the light emitting element 30 on which the high-concentration phosphor-containing resin layer 33 is formed. Accordingly, positional relations are also intact respectively between the low-concentration phosphor-containing resin section 37 and the high-concentration phosphor-containing resin layer 33 and between the low-concentration phosphor-containing resin section 37 and the light emitting element 30. It is made possible to obtain the light emitting device 300 with which the color shading of the emitted light is reduced, and with which the in-plane uniformity of the emitted colors is improved, at a high yield.

Note that the light emitting device 300 of the third embodiment also makes it possible to reduce color shading on the light emission observation surface, and to improve the in-plane uniformity irrespective of the shape of the light emitting device such as the round type or the surface mount type.

Fourth Embodiment

Figure 14:
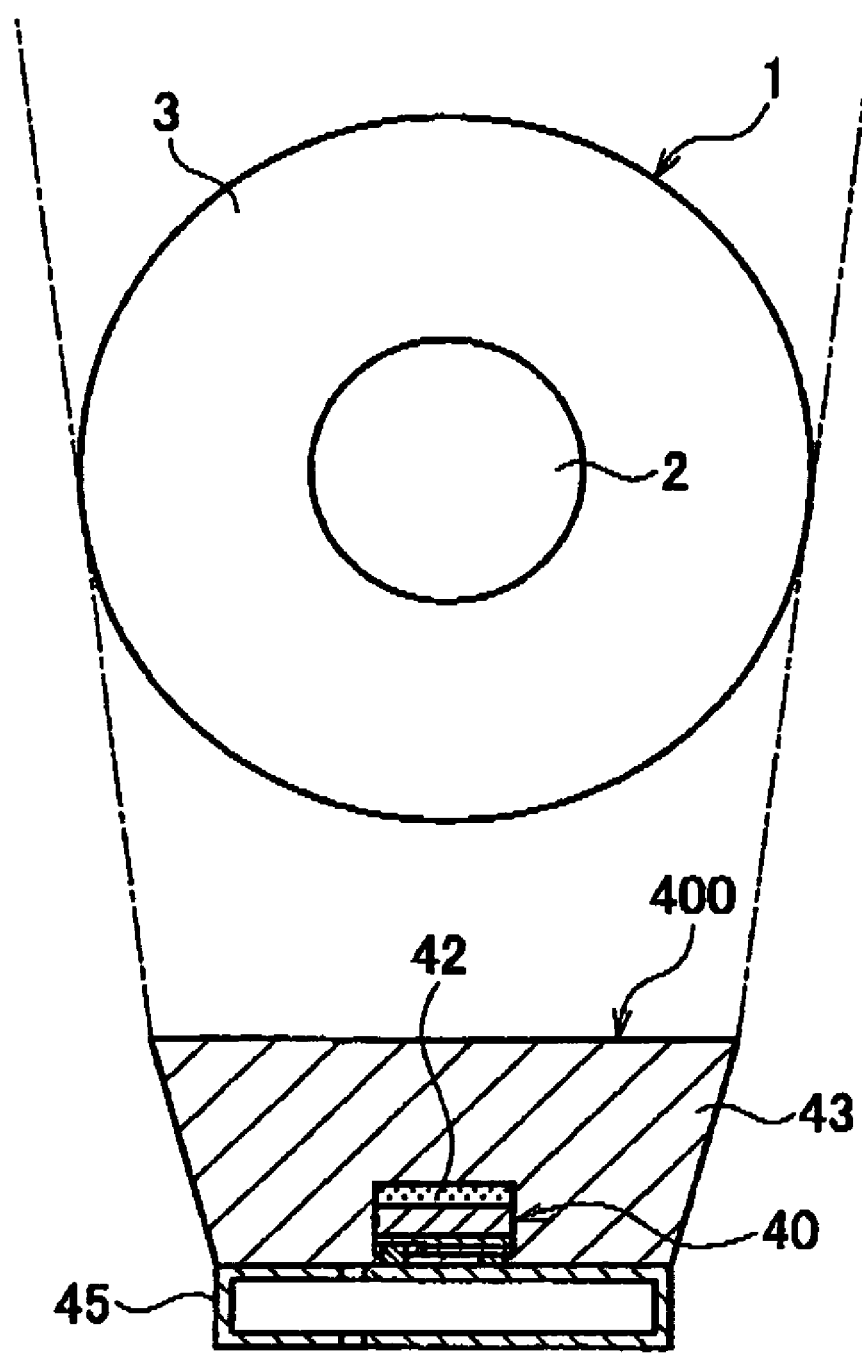
FIG. 14 is a cross-sectional view of a light emitting device according to a fourth embodiment of the present invention, FIG. 14 serving as an explanatory drawing for a light emission characteristic of the light emitting device.

FIG. 14 shows a light emitting device 400 according to a fourth embodiment of the present invention, and FIGS. 16A and 16B show a light emitting element 40 to be mounted thereon. The light emitting device 400 according to the fourth embodiment includes the light emitting element 40 which is mounted in the form of a flip chip type.

As shown in detail in FIGS. 16A and 16B, a transparent insulating substrate 401 made of a sapphire substrate or the like is used in the light emitting device 40. A crystal growth layer 402, which includes a light emitting layer, which is similar to those of the first to third embodiments, is formed on a surface of the substrate. As n electrode 41 and a p electrode 42 are formed respectively in appropriate positions on the crystal growth layer 402. The thickness of the transparent insulating substrate 401 is reduced by use of a method such as grinding or polishing. It is made possible to retrieve light through the substrate 401.

As in the cases of the first to third embodiments, a high-concentration phosphor-containing resin layer 42 is formed on a back surface of the substrate 401 of the light emitting element 40. In the case of the light emitting element 40, there are no electrode regions because a surface constituting the high-concentration phosphor-containing resin layer 42 is formed on the back surface of the substrate 401. Accordingly, the high-concentration phosphor-containing resin layer 42 is formed on the entire back surface of the substrate 401.

As shown in detail in FIG. 14, the light emitting device 400 has a following configuration. By gold bump bonding or the like, the light emitting element 40 is mounted and fixed, in the form of the flip chip type, on an upper surface of a concave section of a base 45 while the back surface of the substrate 401, where the high-concentration phosphor-containing resin layer 42 is formed, is placed up. Accordingly, also in the fourth embodiment, the light emitting element 40 is disposed such that light intensity in a direction perpendicular to the upper surface of the base 45 is higher than that in a direction parallel to the upper surface of the base 45. Furthermore, a low-concentration phosphor-containing resin section 43, which covers the entire light emitting element 40, is formed by filling the concave section of the base 45 with the second phosphor-containing resin as similar to that of the first to third embodiments, and by curing the resin.

Next, descriptions will be provided for a method for manufacturing the light emitting device 400 according to the fourth embodiment having the above-described configuration. The light emitting device 400 according to the fourth embodiment is characterized by including the light emitting element 40 mounted in the form of the flip chip type, and the manufacturing method thereof is as follows.

As shown in FIGS. 16A and 16B, in the light emitting element 40 in which the insulating substrate 401 made of the sapphire substrate is used, the n electrode 41 and the p electrode 42 are formed on one side of the light emitting element 40. The thickness of the insulating substrate 401 is reduced by use of a method such as grinding or polishing. Light can be retrieved through the substrate 401. Accordingly, it is made possible to form the high-concentration phosphor-containing resin layer 42, which has the phosphor concentration from 20 to 25 w %, on the back surface of the substrate 401 of the light emitting element 40. In this case, there are no electrode regions since the high-concentration phosphor-containing resin layer 42 is formed on the back surface of the substrate 401. By use of a method such as dispensing, screen printing or dot printing, the first phosphor-containing resin is coated entirely on a light emitting section of the back surface of the transparent insulating substrate 401. The high-concentration phosphor-containing resin layer 12 is formed by thermosetting or photocuring the above first phosphor-containing resin as shown in FIG. 15. The first phosphor-containing resin is similar to those of the aforementioned embodiments, and has the adjusted phosphor concentration. The crystal growth wafer 410 is cut out into desired dimensions, such as 0.35 mm on a side, by scribing, dicing or the like, and is thereby split into individual chips respectively constituting the light emitting elements 40.

Then, as shown in FIG. 14, by use of a method such as gold bump bonding, each of the light emitting element 40, which is split into a chip, is mounted and fixed on the upper surface of the concave section of the base 45 while the side of the back surface of the substrate 401, where the high-concentration phosphor-containing resin layer 42 is formed, is placed up. Thereafter, the concave section of the transparent insulating substrate 45 is filled with the second phosphor-containing resin by dispensing, and is treated with thermosetting. The low-concentration phosphor-containing resin section 43 is formed. The second phosphor-containing resin is formed directly above the light emitting element 40, and has the phosphor concentration lower, for example, from 10 to 15 w %, than that of the high-concentration phosphor-containing resin layer 42. In this way, the light emitting device 400 of the fourth embodiment is obtained.

As shown in FIG. 14, when the light emitting device 400 thus manufactured is energized to emit light, color shading of the emitted light between the central section 2 and the peripheral section 3 is reduced on the light emission observation surface 1, and the in-plane uniformity is improved as in the cases of the first to third embodiments. In the fourth embodiment, the high-concentration phosphor-containing resin layer 42 is formed directly on the back surface of the substrate 401. Accordingly, a positional relation is intact between the high-concentration phosphor-containing resin layer 42 and the light emitting element 40. The low-concentration phosphor-containing resin section 43 is formed while covering the light emitting element 40 on which the high-concentration phosphor-containing resin layer 42 is formed. Thus, positional relations are also intact respectively between the low-concentration phosphor-containing resin section 43 and the high-concentration phosphor-containing resin layer 42 and between the low-concentration phosphor-containing resin section 43 and the light emitting element 40. Hence, it is made possible to obtain the light emitting device 400 with which the color shading of the emitted light is reduced, and the in-plane uniformity of the emitted colors is improved, at a high yield.

Note that the light emitting device 400 of the fourth embodiment also makes it possible to reduce color shading on the light emission observation surface, and to improve the in-plane uniformity irrespective of the shape of the light emitting device such as the round type or the surface mount type.

Fifth Embodiment

Figure 17:
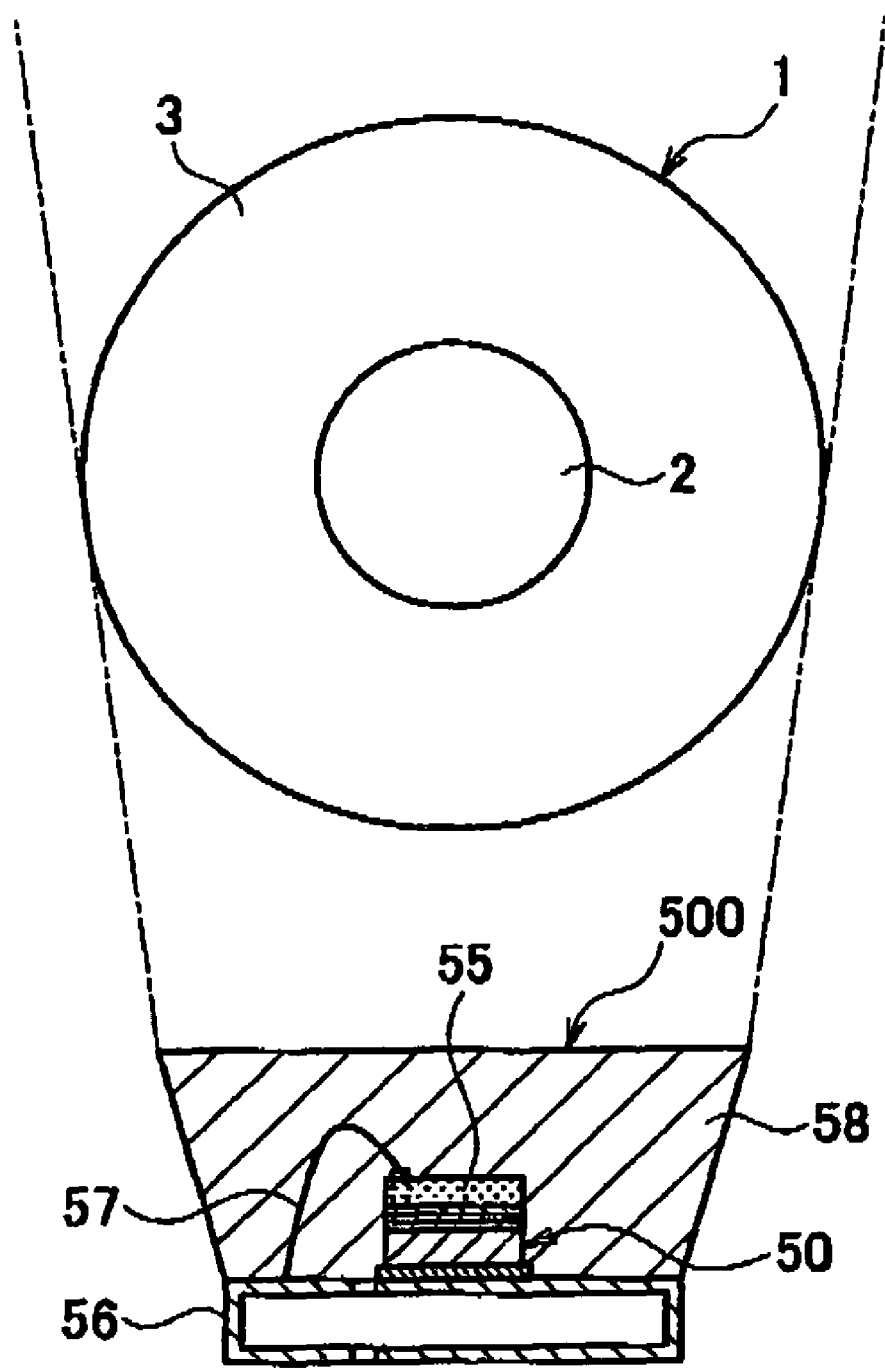
FIG. 17 is a cross-sectional view of a light emitting device according to a fifth embodiment of the present invention, FIG. 17 serving as an explanatory drawing for a light emission characteristic of the light emitting device.

FIG. 17 shows a light emitting device 500 according to a fifth embodiment of the present invention, and FIGS. 21A and 21B each show a light emitting element 50 to be mounted thereon. The light emitting device 500 according to the fifth embodiment is characterized in that a light emitting diode of a substrate replacing type, which has an excellent heat dissipation capacity, is mounted as the light emitting element 50.

As a supporting substrate 511 obtained by replacing a sapphire substrate or a GaN substrate 501 with a crystal growth layer 502, a substance, such as copper tungsten (CuW), which has high heat conductivity and a thermal expansion coefficient close to that of the sapphire substrate or the GaN substrate, is used. A p electrode 52 is joined to a back surface of the supporting substrate 511, the crystal growth layer 502 is joined to an upper surface of the supporting substrate 511, and an n electrode 51 is formed on an n-type surface of the crystal growth layer 502. A high-concentration phosphor-containing resin layer 55 is formed on the n-type surface. The n electrode 51 is formed on the n-type surface of the crystal growth layer 502. Accordingly, when forming the high-concentration phosphor-containing resin layer 55 in which the phosphor concentration thereof is adjusted to the high concentration of 20 to 25 w %, the high-concentration phosphor-containing resin layer 55 is formed so that the first phosphor-containing resin layer is not formed in the regions corresponding to the n electrode 51. The high concentration phosphor-containing resin layer 55 is formed by coating the first phosphor-containing resin by use of the method such as dispensing, screen printing or dot printing, and then by thermosetting or photocuring resin.

As shown in FIG. 17, in the light emitting device 500 of the fifth embodiment, the light emitting element 50 having the above-described structure is mounted and fixed onto an upper surface of a concave section of a base 56 with a conductive adhesive such as Ag paste while the surface of the crystal growth layer 502, where the high-concentration phosphor-containing resin layer 55 is formed, is placed up. Hence, also in the fifth embodiment, the light emitting device 50 is disposed such that light intensity in a direction perpendicular to the upper surface of the base 56 is higher than that in a direction parallel to the upper surface of the base 56. Furthermore, the concave section of the base 56 is filled with the second phosphor containing resin by dispensing, and is treated with thermosetting. Thereby, the low-concentration phosphor-containing resin section 58 is formed. The second phosphor-containing resin contains a phosphor concentration lower than that of the high-concentration phosphor-containing resin layer 55, which is formed directly above the light emitting element 50.

Figure 18:
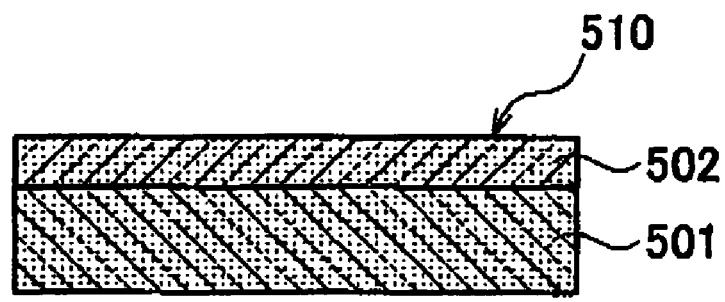
FIG. 18 is a cross-sectional view of a semiconductor wafer used for fabricating a light emitting element to be mounted on the light emitting device according to the fifth embodiment.
Figure 19:
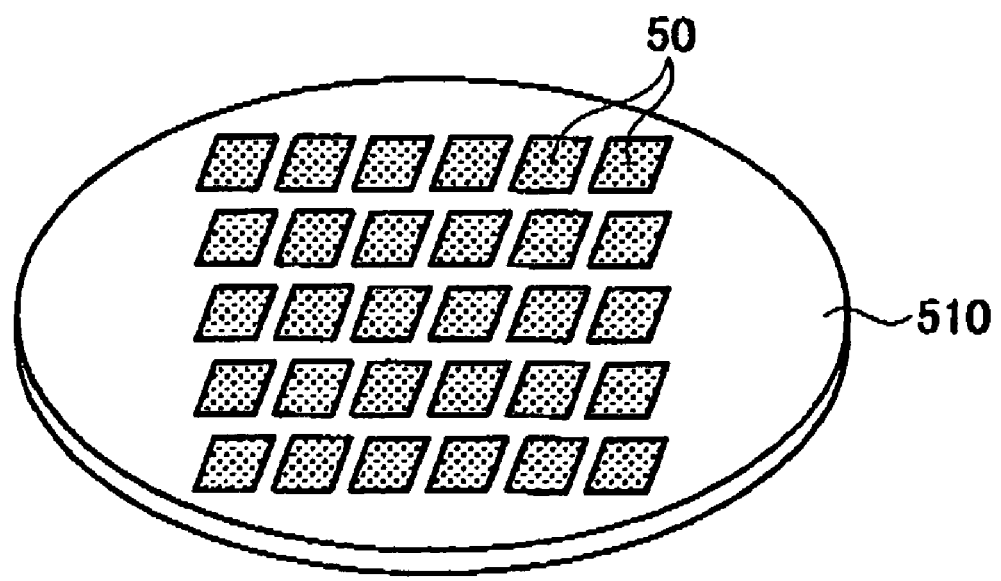
FIG. 19 is a perspective view of the wafer after a process of fabricating the light emitting element to be mounted on the light emitting device according to the fifth embodiment.

Subsequently, descriptions will be provided for a method for manufacturing the light emitting device 500 of the fifth embodiment. As shown in FIGS. 18 and 19, in the method for manufacturing the light emitting device of the fifth embodiment, the semiconductor crystal growth layer 502 of the gallium nitride based material is formed on the crystal substrate 501 such as a sapphire substrate or a GaN substrate. Thereby, a crystal growth wafer 510 for a blue or a near ultraviolet LED is fabricated as in the cases of the first to fourth embodiments.

As a countermeasure for heat radiation, and for reducing an operating voltage, the sapphire or GaN substrate 501 is replaced with the different supporting substrate 511 to be used as the crystal growth layer 502 for the light emitting element in which the substrate such as the sapphire substrate or the GaN substrate is used, as shown in FIGS. 20A and 20B. The above case is particularly for the high-flux light emitting element having dimensions of about 1 mm on a side. For example, a substrate, such as copper tungsten (CuW), which has high heat conductivity and a thermal expansion coefficient close to that of the sapphire substrate of GaN substrate, is effective as the supporting substrate 511 used for a replacement. The crystal growth layer 502 is replaced with the supporting substrate 511 by use of a bounding layer 512. In this case, a p-type side of the crystal growth layer 502 is joined to the supporting substrate 511, and the n-type side thereof is a plane surface. The n-type side is on a surface on which the high-concentration phosphor-containing resin layer 55 is formed as in the cases of the first to fourth embodiments. Since the n electrode 51 is formed on the n-type surface, when forming the high-concentration phosphor-containing resin layer 55 in which the phosphor concentration thereof is adjusted to the high concentration from 20 to 25 w %, the high-concentration phosphor-containing resin layer 55 is formed so that the first phosphor-containing resin layer is not formed in the region corresponding to the n electrode 51. The high-concentration phosphor-containing resin layer 55 is formed by coating the first phosphor-containing resin by use of the method such as dispensing, screen printing or dot printing, and then by thermosetting or photocuring the resin.

Thereafter, a crystal growth wafer 520 shown in FIG. 20B is cut out into desired dimensions by scribing, dicing or the like, and is thereby split into individual chips respectively constituting the light emitting elements 50.

Subsequently, as shown in FIG. 17, each of the light emitting element 50, which is split into a chip, is mounted and fixed on the upper surface of the concave section of the base 56 with a conductive adhesive such as Ag paste while the surface of the crystal growth layer 502 where the high-concentration phosphor-containing resin layer 55 is formed is placed up. Thereafter, by means of bonding, electric conductivity is achieved with a gold wire 57, as in the cases of the first to fourth embodiments. Subsequently, by use of dispensing, the concave section of the base 35 is filled with the second phosphor-containing resin having the phosphor concentration in the range of 10 to 15 w %, and is treated with thermosetting. Thereby, the low-concentration phosphor-containing resin section 58 is formed while covering the periphery and the upper surface of the light emitting element 50. Accordingly, the light emitting device 500 is obtained.

When the light emitting device 500 thus manufactured is energized to emit light, color shading of the emitted light between the central section 2 and the peripheral section 3 is reduced on the light emission observation surface 1 shown in FIG. 17, and the in-plane uniformity is improved, as in the cases of the first to fourth embodiments. Moreover, also in the fifth embodiment, the high-concentration phosphor-containing resin layer 55 is formed directly on the surface of the crystal growth layer 502. Accordingly, a positional relation is intact between the high-concentration phosphor-containing resin layer 55 and the light emitting element 50. Furthermore, the low-concentration phosphor-containing resin section 58 is formed while covering the light emitting element 50 on which the high-concentration phosphor-containing resin layer 55 is formed. Thus, positional relations are also intact respectively between the low-concentration phosphor-containing resin section 58 and the high-concentration phosphor-containing resin layer 55 and between the low-concentration phosphor-containing resin section 58 and the light emitting element 50. Hence, it is made possible to obtain the light emitting device 500 in which the color shading of the emitted light is reduced, and in which the in-plane uniformity of the emitted colors is improved, at a high yield.

Note that the light emitting device 500 of the fifth embodiment also makes it possible to reduce color shading on the light emission observation surface, and to improve the in-plane uniformity irrespective of the shape of the light emitting device such as the round type or the surface mount type.

Sixth Embodiment

Figure 22:
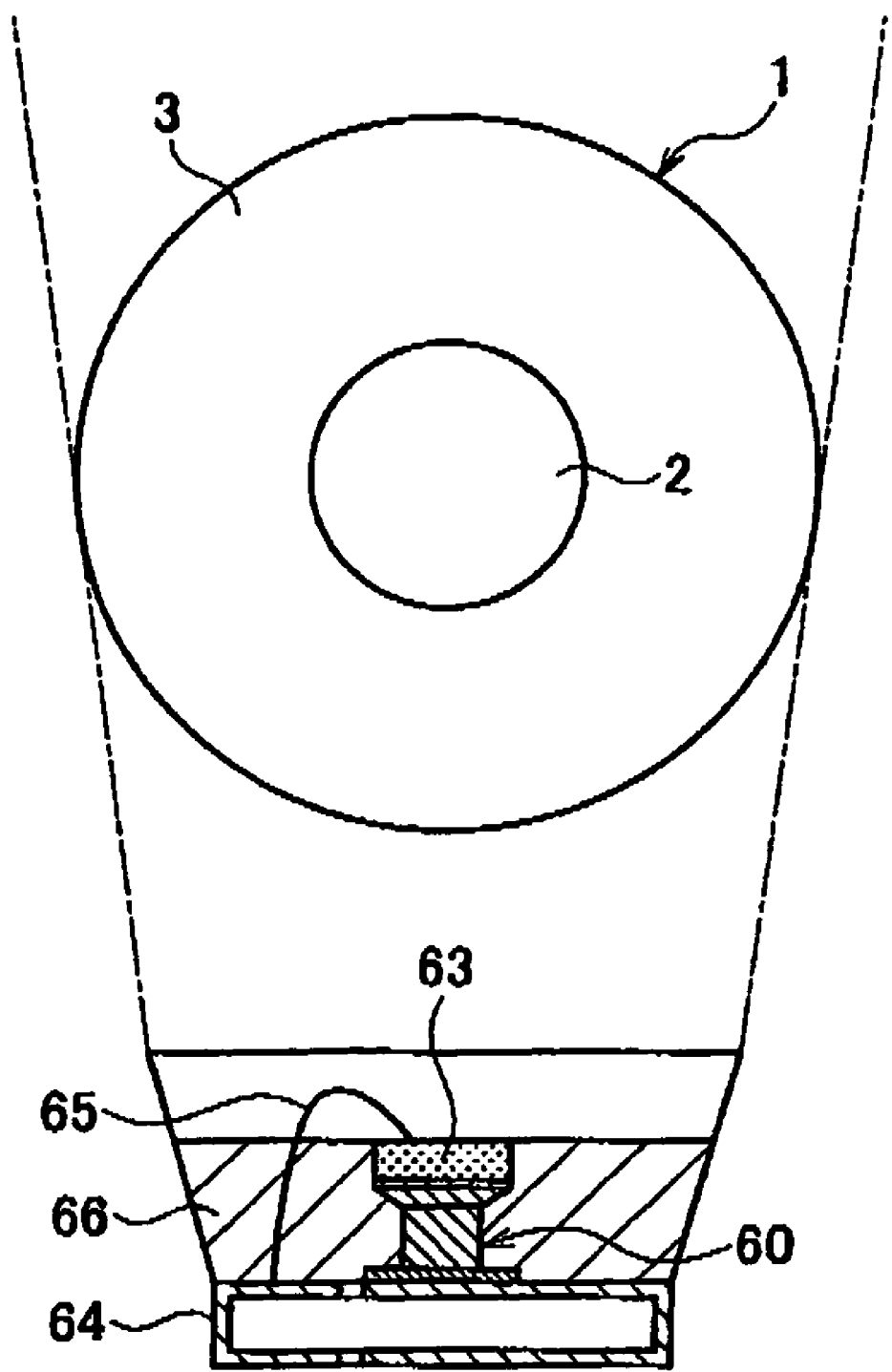
FIG. 22 is a cross-sectional view of a light emitting device according to a sixth embodiment of the present invention, FIG. 22 as an explanatory drawing for a light emission characteristic of the light emitting device.

FIG. 22 shows a light emitting device 600 according to a sixth embodiment of the present invention, and FIGS. 24A and 24B each show a light emitting element 60 to be mounted thereon. The light emitting device 600 according to the sixth embodiment includes the light emitting element 60 which is mounted in the form of the junction-up type. The light emitting device 600 has a structure in which at least part of the light emitting element is tapered in order to improve light retrieval, and is disposed such that light intensity in a direction parallel to an upper surface of a base is higher than that in a direction perpendicular to the upper surface of the base.

As shown in FIGS. 24A and 24B, a conductive SiC substrate is used as a substrate 601 in the light emitting element 60, for example. A crystal growth layer 602 is formed on a surface of the substrate 601, and phosphor-containing transparent resin having a relatively low concentration, such as in a range of 10 to 15 w % (hereinafter referred to as third phosphor-containing transparent resin), is coated on a surface of the crystal growth layer 602. The third phosphor-containing transparent resin is then cured to form a low-concentration phosphor-containing resin layer 63. A p electrode 61 is formed on a surface of the light emitting element 60 where the low-concentration phosphor-containing resin layer 63 is formed, and an n electrode 62 is formed on an opposite surface of the light emitting element 60.

As shown in FIG. 22, in the light emitting device 600 according to the sixth embodiment, the light emitting element 60 of the above-described configuration is mounted and fixed onto a concave section of a base 64 with a conductive adhesive such as Ag paste while surface of the crystal growth layer 602, where the low-concentration phosphor-containing layer 63 is formed, is placed up. In this event, as shown in FIG. 22, the light emitting element 600 of the sixth embodiment has a configuration in which a cross-sectional area of the substrate 601 is made smaller than a cross-sectional area of the surface of the crystal growth layer 602 where the low-concentration phosphor-containing resin layer 63 is formed. For this reason, the light emitting element 60 in the sixth embodiment is disposed such that light intensity in a direction parallel to an upper surface of the base 64 is higher than that in a direction perpendicular to the upper surface of the base 64. By means of bonding, electric conductivity is achieved with a gold wire 65. Furthermore, the light emitting device 600 has a following configuration. By use of dispensing, the concave section of the base 35 and surroundings of the light emitting element 60 are filled with phosphor-containing resin having a phosphor concentration higher than that of the low-concentration phosphor-containing resin 63 (hereinafter referred to as fourth phosphor-containing transparent resin), and is treated with thermosetting. Thereby, a high-concentration phosphor-containing resin section 66 is formed. The high-concentration phosphor-containing resin section 66 has the phosphor concentration in a range of 20 to 25 w %, for instance.

Next, descriptions will be provided for a method for manufacturing the light emitting device 600 having the above-described configuration. First, as shown in FIG. 23, a semiconductor crystal growth layer of a gallium nitride based material is formed on a conductive crystal substrate made of a SiC substrate to fabricate a crystal growth wafer 610 for blue or ultraviolet LEDs. Thereafter, a fabrication process, such as a process of fabricating an electrode, is performed to form LED structures.

After the fabrication process, a large number of LED light emitting element 60 are formed on the wafer 610. Dimensions of the respective LED chips are set to be 0.35 mm on a side, for example. Subsequently, the third phosphor-containing resin is coated on an upper portion of the crystal growth wafer 610, where the LED light emitting element chips are formed, by use of the method such as dispensing, screen printing or dot printing. Thereafter the resin is treated by thermosetting or photocuring. Accordingly, the low-concentration phosphor-containing resin layer 63 is formed.

As shown in FIGS. 24A and 24B, the p electrode 61 is formed on a surface where the low-concentration phosphor-containing resin layer 63 is formed in the light emitting element 60 mounted in the sixth embodiment. For this reason, when forming the low-concentration phosphor-containing resin layer 63, which has the adjusted phosphor concentration, on the surface of the crystal growth layer 602 in the light emitting element 60, the high-concentration phosphor-containing resin layer 63 is formed so that the low-concentration phosphor-containing resin layer is not formed in the region corresponding to the n electrode 61. The high-concentration phosphor-containing resin layer 63 is formed by coating the third phosphor-containing resin by use of the method such as dispensing, screen printing or dot printing, and then by thermosetting or photocuring the resin. The low-concentration phosphor-containing resin layer 63 has the thickness in a range of about 5 to 10 μm and the phosphor concentration in a range of 10 to 15 w %.

Figure 25A:
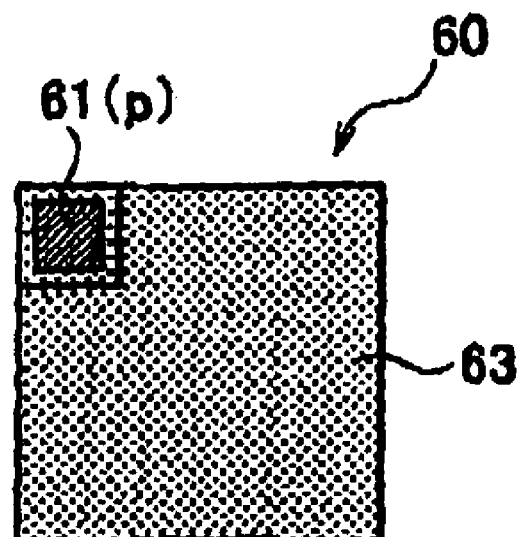
FIG. 25A is a plan view.
Figure 25B:
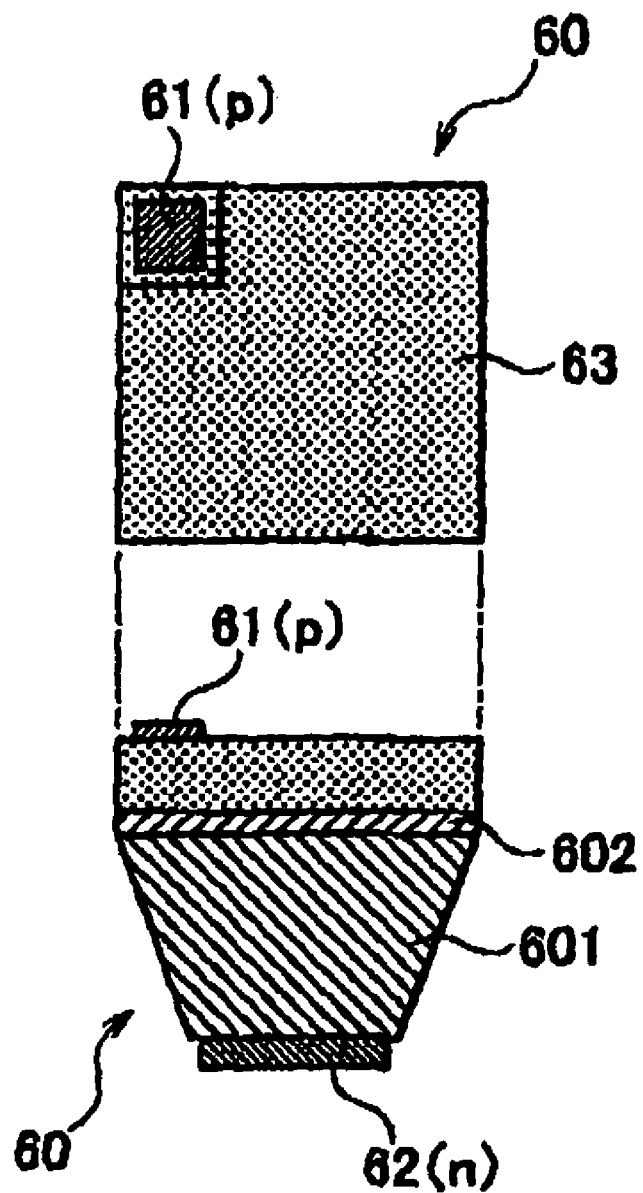
FIG. 25B is a cross-sectional view of another example of the light emitting element to be mounted on the light emitting device according to the sixth embodiment.

Thereafter, by dicing with a tapered blade, the crystal growth wafer 610 is cut out into desired dimensions from the substrate 601. Thereby, the crystal growth wafer 610 is split into chips with dimensions of, for example, 0.35 mm on a side, chips respectively constituting individual light emitting elements 60. In this way, a taper can be formed on at least one of side surfaces. Incidentally, in the sixth embodiment, the shape of the light emitting element 60 may be formed into a shape in which all of the side surfaces of the conductive substrate 601 are tapered downward, as shown in FIG. 25B.

Subsequently, as shown in FIG. 22, each of the light emitting element 60, which is split into a chip, is mounted and fixed on the surface of the concave section of the base 64 with a conductive adhesive such as Ag paste while the surface of the crystal growth layer 602, where the low-concentration phosphor-containing resin layer 63 is formed, is placed up, by use of dispensing, the concave section of the bases 64 and surroundings of the light emitting element 60 are filled with the fourth phosphor-containing resin, and is treated with thermosetting. A high-concentration phosphor-containing resin section 66 is formed. Accordingly, the light emitting device 600 is obtained. The phosphor concentration of the high-concentration phosphor-containing resin section 66 is in a range of 20 to 25 w %.

As opposed to the cases of the first to fifth embodiments, in the light emitting device 600 of the sixth embodiment, the phosphor concentration of the phosphor-containing transparent resin section 66, which is filled around the light emitting element 60, is set higher than the phosphor concentration of the phosphor-containing transparent resin layer 63 formed directly above the light emitting element 60. This is because the light emitting element 60 is disposed on the upper surface of the base 64 such that the light intensity in the direction parallel to the upper surface of the base is higher than that in the direction perpendicular to the upper surface of the base. In other words, in the light emitting device 600 of the sixth embodiment, as shown in FIG. 22, the light, which has the high light intensity, and which is emitted in a horizontal direction from the light emitting element 60 to the upper surface of the base 64, is projected to the outside through the high-concentration phosphor-containing resin section 66. On the other hand, the light, which has the low light intensity, and which is emitted in the perpendicular direction from the light emitting element 60 to the upper surface of the base 64, is projected to the outside through the low-concentration phosphor-containing resin layer 63. Hence, the light, which has the high light intensity, and which is emitted in the direction parallel to the upper surface of the base 64 is efficiently converted into light having a different wavelength by the phosphor in the high-concentration phosphor-containing resin section 66. As a consequence, as compared to the conventional case, in which the peripheral section 3 of the light emission observation surface 1 is heavily tinted by a blue to near ultraviolet color, and in which the central section 2 exhibits a white color, as shown in FIG. 4, the light emitting device 600 of the sixth embodiment causes the white color in the peripheral section 3 as well. In this way, it is made possible to reduce color shading of the emitted light between the central section 2 and the peripheral section 3, and to improve the in-plane uniformity. Moreover, in the sixth embodiment, the low-concentration phosphor-containing resin layer 63 is formed directly on the surface of the crystal growth layer 602. Accordingly, a positional relation is intact between the low-concentration phosphor-containing resin layer 63 and the light emitting element 60. The high-concentration phosphor-containing resin section 66 is formed while covering the surroundings of the light emitting element 60 on which the low-concentration phosphor-containing resin layer 63 is formed. Thus, positional relations are also intact respectively between the high-concentration phosphor-containing resin section 66 and the low-concentration phosphor-containing resin layer 64 and between the high-concentration phosphor-containing resin section 66 and the light emitting element 60. Hence, it is made possible to obtain the light emitting device 600 in which the color shading of the emitted light is improved, and in which the in-plane uniformity of the emitted colors is improved, at a high yield.

Note that the structure of the light emitting device 600 according to the sixth embodiment also makes it possible to reduce color shading on the light emission observation surface, and to improve the in-plane uniformity irrespective of the shape of the light emitting device such as a round type or a surface mount type.

Each of the embodiments described above illustrates the light emitting device in which the light emitting element is mounted, the nitride semiconductor being used for the semiconductor crystal growth layer of the light emitting element. However, the present invention is not limited to this configuration. It is also possible to adopt a LED light emitting element in which a semiconductor of a zinc oxide type is used. In addition, as for the substrate, it is possible to use an insulating substrate, such as a sapphire substrate, and a conductive substrate, such as a GaN substrate or a SiC substrate.

EXAMPLE 1

The light emitting device 100 having the structure shown in FIG. 3 is fabricated with the following manufacturing method. First, as shown in FIG. 4, the semiconductor crystal growth layer 102 of the gallium nitride based material is formed, as the LED light emitting element 10, on the sapphire crystal substrate 101 having the thickness of 250 μm. Then, the crystal growth wafer 110 for blue LEDs is fabricated, and the fabrication process, such as the process of fabricating the electrode, is performed to form LED structures. Subsequently, as shown in FIG. 6, by use of screen printing, silicon transparent resin containing 25 w % of an oxide phosphor (hereinafter referred to as first phosphor-containing silicon resin) is coated on the surface of the semiconductor crystal growth layer 102. Accordingly, the high-concentration phosphor-containing resin layer 12 having the thickness of 10 μm is formed by thermosetting the resin.

Thereafter, by means of scribing, the crystal growth wafer 110 is cut out into desired dimensions of 0.35 mm on a side, and is thereby split into individual chips respectively constituting the light emitting elements 10.

Next, as shown in FIG. 3, each of the light emitting elements 10, which is split into each chip, is mounted and fixed on the upper surface of the concave section of the base 15, which has the height of 300 μm and the diameter of 400 μm, with a conductive adhesive made of Ag paste. Thereafter, by means of bonding, the gold wires 16 and 17 are respectively connected to the n electrode 13 and the p electrode 14, and the feed pattern is connected to each of the wires 16 and 17. The gold wires 16 and 17, n electrode 13, p electrode 14 and the feed pattern are caused to be electrically conductive to one another. Subsequently, by use of dispensing, the concave section of the base 15 is filled with silicon transparent resin (hereinafter referred to as second phosphor-containing silicon resin), and is treated by thermosetting. Thereby, the low-concentration phosphor-containing resin section 18 is formed. The second phosphor-containing silicon resin had a phosphor concentration, which is the phosphor concentration of 15 w %, the concentration being lower than that of the high-concentration phosphor-containing resin layer 12 formed on a surface of the semiconductor crystal growth layer 102. In this way, the light emitting device 100 is obtained.

When the light emitting device 100 thus manufactured is energized to emit light, it is confirmed that color shading of the emitted light is reduced between the central section 2 and the peripheral section 3 on the light emission observation surface 1, and that the in-plane uniformity is improved, as shown in FIG. 3.

EXAMPLE 2

The light emitting device 200 shown in FIG. 8 is fabricated with the following manufacturing method. As shown in FIG. 9, in the light emitting element 20 in which the conductive substrate 201 of GaN substrate having the thickness of 250 μm, the p electrode 21 is formed on a surface of the first phosphor-containing silicon resin, the surface being one where the high-concentration phosphor-containing resin layer 22 is formed. The high-concentration phosphor-containing resin layer 22 is made of the first phosphor-containing silicon resin, which is similar to that of Example 1. For this reason, when forming the high-concentration phosphor-containing resin layer 22 directly above the light emitting element 20, by use of screen printing, the first phosphor-containing silicon resin is coated so that the high-concentration phosphor-containing resin layer is not formed in the region corresponding to the p electrode 21. Accordingly, the high-concentration phosphor-containing resin layer 22 having the thick of 10 μm is formed by thermosetting the resin. By means of scribing, the crystal growth wafer 210 is cut out into desired dimensions, namely, 0.35 mm on a side. Thereby, the crystal growth is split into individual chips respectively constituting the light emitting elements 20.

Subsequently, as shown in FIG. 8, each of the light emitting element 20, which is split into a chip, is mounted and fixed, in the form of the junction-up type, on the upper surface of the concave section of the base 25, which is similar to that of Example 1, with a conductive adhesive made of Ag paste while facing the crystal growth layer 202 up. Thereafter, by means of bonding electric conductivity is achieved with the gold wire 23. After that, by means of dispensing, the concave section of the base 25 is filled with the second phosphor-containing silicon resin, which is similar to that of Example 1. Then, the second phosphor-containing silicon resin is treated with thermosetting to form the low-concentration phosphor-containing resin section 24. In this way, the light emitting device 200 is obtained.

When the light emitting device 200 thus manufactured is energized to emit light, it is confirmed that color shading of the emitted light between the central section 2 and the peripheral section 3 is reduced on the light emission observation surface 1, and that the in-plane uniformity is improved, as shown in FIG. 8.

EXAMPLE 3

The light emitting device 300 shown in FIG. 11 is fabricated with the following manufacturing method. As shown in FIGS. 13A and 13B, as the LED light emitting element 30, the crystal growth layer 302 similar to that of Example 1 is formed on the GaN substrate 301 having the thickness of 250 µm. Moreover, the p electrode 31 is formed on the surface of the crystal growth layer 302, and the electrode 32 is formed on the back surface of the conductive substrate 301. Thereafter, the high-concentration phosphor-containing resin layer 33, which is made of the first phosphor-containing silicone resin as similar to that of Example 1, is formed to have the thickness of 10 µm. The high-concentration phosphor-containing resin layer 33 is formed on the entire back surface of the conductive substrate 301 except for the region of the n electrode 32. The n electrode 32 is formed on the surface where the high-concentration phosphor-containing resin layer 33 made of the first phosphor-containing silicon resin is formed. Accordingly, as shown in FIG. 12, when forming the high-containing phosphor-containing resin layer 33, which has the adjusted phosphor concentration, on the back surface of the wafer 310, the second phosphor-containing silicon resin is coated on the wafer 310 by use of screen printing so that the high-concentration phosphor-containing resin layer is not formed in the region corresponding to the n electrode 32. Accordingly, the high-concentration phosphor-containing resin layer 33 having the thickness of 10 µm is formed by thermosetting the resin. Thereafter, by means of scribing, the crystal growth wafer 310 is cut out into desired dimensions, namely, 0.35 mm on a side. Thereby, the crystal growth wafer 310 is split into individual chips respectively constituting the light emitting elements 30.

Next, as shown in FIG. 11, each of the light emitting element 30, which is split into a chip, is mounted and fixed on the upper surface of the concave section of the base 35 similar to that of Example 1. By use of a conductive adhesive made of Ag past, the light emitting elements 30 are fixed in the form of the junction-down type while the side of the back surface of the substrate 301 is placed up, thereafter, by use of bonding, electric conductivity is achieved with the gold wire 36. Subsequently, by use of dispensing, the concave section of the base 35 and surroundings of the light emitting element 60 are filled with the second phosphor-containing resin, and is treated with thermosetting. Thereby, a low-concentration phosphor-containing resin section 37 is formed while covering the surrounds, and the upper surface, of the light emitting element 30. Accordingly, the light emitting device 300 is obtained.

When the light emitting device 200 thus manufactured is energized to emit light, it is confirmed that color shading of the emitted light is reduced on the light emission observation surface 1, and the in-plane uniformity is improved, as shown in FIG. 11.

EXAMPLE 4

The light emitting device 400 shown in FIG. 14 is fabricated with the following manufacturing method. The light emitting device 400 included the light emitting element 40 which is mounted in the form of the flip chip type.

The sapphire insulating substrate 401 having the thickness of 250 µm is used. The semiconductor crystal growth layer 402 similar to that of Example 1 is formed on the surface of the sapphire insulating substrate 401, and the n electrode 41 and the p electrode 42 are formed on the surface of the crystal growth layer 402. The transparent sapphire substrate 401 is polished to the thickness of 80 µm to retrieve light from the substrate 401. Subsequently, the first phosphor-containing silicon resin, which is similar to that of Example 1, is coated on the entire light emitting section of the back surface of the substrate 401, and is treated by thermosetting. The high-concentration phosphor-containing resin 42 is formed in the thickness of 10 µm, and the crystal growth wafer 410 is thus obtained, as shown in FIG. 15. By use of scribing, the crystal growth wafer 410 is cut out into desired dimensions, namely, 0.35 mm on a side, and is thereby split into individual chips respectively constituting the light emitting elements 40.

Next, as shown in FIG. 14, each of the light emitting element 40, which is split into a chip, is mounted and fixed on the upper surface of the concave section of the base 45 similar to that of Example 1. By use of gold bump bonding, the light emitting elements 40 are fixed in the form of the flip chip type while the side of the back surface of the substrate 401, on which the high-concentration phosphor-containing resin layer 42 is formed, is placed up. By use of dispensing, the concave section of the base 45 is filled with the second phosphor-containing silicon resin similar to that of Example 1, and is treated by thermosetting. Accordingly, the low-concentration phosphor-containing resin section 43 is formed, and the light emitting device 400 is thus obtained.

When the light emitting device 400 thus manufactured is energized to emit light, it is confirmed that color shading of the emitted light is reduced on the light emission observation surface 1, and that the in-plane uniformity is improved, as shown in FIG. 14.

EXAMPLE 5

The light emitting device 500 shown in FIG. 17 is fabricated with the following manufacturing method. The light emitting diode of the substrate replacing type having an excellent heat dissipation capacity is mounted, as the light emitting element 50, on the light emitting device 500 as shown in FIGS. 21A and 21B.

As shown in FIG. 18 and FIG. 19, the semiconductor crystal growth layer 502 of the gallium nitride based material is formed on the crystal substrate 501 made of the sapphire substrate having the thickness of 250 µm. Thereby, the crystal growth wafer 510 for blue LEDs is fabricated. Next, as shown in FIGS. 20A and 20B, the sapphire substrate 501 is replaced with the different supporting substrate 511 to be used as the crystal growth layer 502. Copper tungsten (CuW) in the thickness of 200 µm is used as the supporting substrate 511 for a replacement. The copper tungsten has high heat conductivity and a thermal expansion coefficient close to that of the sapphire substrate or GaN substrate. The crystal growth layer 502 is replaced with the supporting substrate 511 by use of the bounding layer 512 of AuSn in the thickness of 10 μm. In this case, the p-type side of the crystal growth layer 502 is joined to the supporting substrate 511, and the n-type side thereof is the plane surface. The n-type side is on a surface on which the high-concentration phosphor-containing resin layer 55 is formed as in the cases of Examples 1 to 4. Since the n electrode 51 is formed on the n-type surface, when forming the high-concentration phosphor-containing resin layer 55, the first phosphor-containing silicon resin is coated by use of screen printing so that the high-concentration phosphor-containing resin layer is not formed in the region corresponding to the p electrode 51. Accordingly, the high-concentration phosphor-containing resin layer 55 having the thickness of 10 mm is formed by thermosetting the resin.

Thereafter, by means of dicing, the crystal growth wafer 520 shown in FIG. 20B is cut out into desired dimension, namely, 1 mm on a side, and is thereby split into individual chips respectively constituting the light emitting elements 50, as shown in FIGS. 21A and 21B.

Subsequently, as shown in FIG. 17, each of the light emitting element 50, which is split into a chip, is mounted and fixed on the upper surface of the concave section of the base 56 similar to that of Example 1. By use of a conductive adhesive made of Ag paste, the light emitting elements 50 are fixed while the surface of the crystal growth layer 501 where the high-concentration phosphor-containing resin layer 55 is formed, is placed up. By use of bonding, electric conductivity is achieved with the gold wire 57 as in the cases of Examples 1 and 2. After that, by use of dispensing, the concave section of the substrate 56 is filled with the second phosphor-containing silicon resin similar to that of Example 1, and is treated by thermosetting. The low-concentration phosphor-containing resin section 58 is formed while covering the surroundings, and the upper surface, of the light emitting element 50. Accordingly, the light emitting device 500 is obtained.

When the light emitting device 500 thus manufactured is energized to emit light, it is confirmed that color shading of the emitted light is reduced on the light emission observation surface 1, and that the in-plane uniformity is improved, as shown in FIG. 17.

EXAMPLE 6

The light emitting device 600 shown in FIG. 22 is fabricated with the following manufacturing method. First, as shown in FIG. 23, the semiconductor crystal growth layer 602 of the gallium nitride based material is formed on the conductive crystal substrate made of the SiC substrate, and the crystal growth wafer 610 for blue LEDs is fabricated. The fabrication process, such as the process for fabricating the electrode is performed to form LED structures. After the fabrication process, a large number of LEDs 60 are formed on the wafer 610. Dimensions of each LED chip are set to be 0.35 mm on a side.

By use of dot printing, the first phosphor-containing silicon resin, which contained 15 w % of an oxide phosphor, is coated on the surface of the crystal growth layer 602 of the crystal growth wafer 610. Accordingly, the low-concentration phosphor-containing resin layer 63 having the thickness 10 μm is formed by thermosetting the resin. As shown in FIGS. 24A and 24B, in the light emitting element 60, the p electrode 61 is formed on the surface where the low-concentration phosphor-containing resin layer 63 is formed. Accordingly, when following the low-concentration phosphor-containing resin layer 63 on the surface of the crystal growth layer 602 in the light emitting element 60, the silicon transparent resin is coated by use of screen printing so that the low-concentration phosphor-containing resin layer is not formed in the region corresponding to the p electrode 61. Accordingly, the low-concentration on phosphor-containing resin layer 63 is formed by thermosetting or photocuring the resin. The low-concentration phosphor-containing resin layer 63 had the thickness of 10 μm.

Thereafter by means of dicing with a tapered blade, the crystal growth wafer 610 is cut out into desired dimensions from the substrate 601, and individual light emitting elements 60 are formed. The chip dimensions are set to 0.35 mm on a side. In this way, a taper is provided on at least one of the side surfaces of the light emitting element 60.

As shown in FIG. 22, each of the light emitting elements 60, which is split into a chip, is mounted and fixed on the upper surface of the concave section of the base 64 with the dimensions similar to those of Example 1. By use of a conductive adhesive made of Ag paste, the light emitting elements 60 are fixed while the surface of the crystal growth layer 602 where the low-concentration phosphor-containing resin layer 63 is formed, is placed up. Thereafter, the concave section of the substrate 64 is filled with the transparent resin with the phosphor concentration of 25 w %, and the high-concentration phosphor-containing resin section 66 formed. Accordingly, the light emitting device 600 is obtained. The transparent resin has a phosphor concentration higher than that of the low-concentration phosphor-containing resin layer 63.

When the light emitting device 600 thus manufactured is energized to emit light, it is confirmed that color shading of the emitted light between the central section 2 and the peripheral section 3 is reduced on the light emission observation surface 1, and that the in-plane uniformity is improved, as shown in FIG. 22.

What is claimed is:
1. A light emitting device comprising:
a base having a concave portion;
a light emitting element disposed on the concave portion of the base;
a phosphor containing transparent resin section containing a phosphor absorbing light emitted from the light emitting element and emitting light having a wavelength different from a wavelength of the absorbed light; and
a high-concentration phosphor-containing resin layer containing a phosphor for absorbing light emitted from the light emitting element and for emitting light having a wavelength different from a wavelength of the absorbed light, and having a phosphor concentration higher than a phosphor concentration of the phosphor-containing transparent resin section;
wherein a light intensity of light emitted from an upper surface of the light emitting element is higher than a light intensity of light emitted from a side surface of the light emitting element;
the high-concentration phosphor-containing resin layer contacting an upper surface of the light emitting element; and
the phosphor-containing transparent resin section contacting an upper surface of the high-concentration phosphor-containing resin layer and a side surface of the light emitting element.
2. The light emitting device according to claim 1, wherein:
part of the light emitted from the light emitting element, the part being emitted in the perpendicular direction, is projected to the outside through the high-concentration phosphor-containing resin layer and through the phosphor-containing transparent resin section; and part of the light emitted from the light emitting element, the part being emitted in the parallel direction, is projected to the outside through the phosphor-containing transparent resin section.

3. The light emitting device according to claim 1, wherein the light emitting element emits any one of blue light and ultraviolet light.

4. The light emitting device according to claim 1, wherein the phosphor-containing transparent resin section has phosphor concentration in a range of 10 to 15 weight percent, and the high-concentration phosphor-containing resin layer has phosphor concentration in a range of 20 to 25 weight percent.

5. A light emitting device comprising:
a base having a concave portion;
a light emitting element disposed on the concave portion of the base;
a phosphor-containing transparent resin section containing a phosphor for absorbing light emitted from the light emitting element and for emitting light having a wavelength different from a wavelength of the absorbed light; and
a low-concentration phosphor-containing resin layer containing a phosphor for absorbing light emitted from the light emitting element and for emitting light having a wavelength different from a wavelength of the absorbed light, and having a phosphor concentration lower than a phosphor concentration of the phosphor-containing transparent resin section;
wherein a light intensity of light emitted from a side surface of the light emitting element is higher than a light intensity of light emitted from an upper surface of the light emitting element;
the low-concentration phosphor-containing resin layer contacting an upper surface of the light emitting element; and
the phosphor-containing transparent resin section contacting a side surface of the light emitting element and a side surface of the low-concentration phosphor-containing resin layer.

6. The light emitting device according to claim 5, wherein:
part of the light emitted from the light emitting element, the part being emitted in the perpendicular direction, is projected to the outside through the low-concentration phosphor-containing resin layer; and
part of the light emitted from the light emitting element, the part being emitted in the parallel direction, is projected to the outside through the phosphor-containing transparent resin section.

7. The light emitting device according to claim 5, wherein the light emitting element emits any one of blue light and ultraviolet light.

8. The light emitting device according to claim 5, wherein the phosphor-containing transparent resin section has phosphor concentration in a range of 20 to 25 weight percent, and the low-concentration phosphor-containing resin layer has phosphor concentration in a range of 10 to 15 weight percent.

9. The light emitting device according to claim 1, wherein the high-concentration phosphor-containing resin layer is formed only on the upper surface of the light emitting device.

10. The light emitting device according to claim 1, wherein the light emitting element is a light emitting diode of a substrate replacing type.

11. The light emitting device according to claim 5, wherein at least a part of a side surface of the light emitting device is tapered with respect to the upper surface of the light emitting element.

12. A method for manufacturing a light emitting device, comprising the steps of:
forming, on a surface of a light emitting element, a phosphor-containing resin layer containing a phosphor which absorbs light emitted from a light emitting element, and which emits light having a wavelength different from a wavelength of the absorbed light;
disposing the light emitting element onto a concave portion of a base, and
filling, in the concave portion of the base on which the light emitting element is disposed, a phosphor-containing transparent resin containing a phosphor for absorbing light emitted from the light emitting element and for emitting light having a wavelength different from a wavelength of the absorbed light, and having a phosphor concentration different from the phosphor-containing resin layer, the phosphor-containing transparent resin contacting a side of the light emitting device, wherein
the light emitted from the light emitting element at an upper surface of the light emitting element has a higher light intensity than light emitted from a side surface of the light emitting element; and
a phosphor concentration of the phosphor-containing resin layer is higher than a phosphor concentration of the phosphor-containing transparent resin.

13. The method for manufacturing the light emitting device according to claim 12, wherein
the step of forming a phosphor-containing resin layer on a surface of the light emitting element comprises:
forming a semiconductor layer having a light emitting layer on a surface of a base;
forming the phosphor-containing resin layer on the semiconductor layer; and
dividing the base on which the semiconductor layer and the phosphor-containing resin layer is formed.

14. The method for manufacturing the light emitting device according to claim 12, wherein
the step of disposing the light emitting element on the concave portion comprises disposing the light emitting element upon the concave portion of the base such that the surface upon which the phosphor-containing resin layer of the light emitting element is formed is disposed distal the base.

15. The light emitting device of claim 1, wherein the upper surface of light emitting device is an n-type semiconductor.

16. The light emitting device of claim 1, wherein a supporting substrate and a crystal growth layer are joined to an upper surface of the supporting substrate by a bounding layer, and the high concentration phosphor containing resin layer is formed directly on the surface of the crystal growth layer.

17. The method for manufacturing the light emitting device according to claim 12, wherein the phosphor containing resin layer is formed directly on an upper surface of the light emitting element, and
the phosphor-containing transparent resin layer is formed directly on an upper surface of the phosphor-containing resin layer and a side surface of the light emitting element.

18. The method for manufacturing the light emitting device according to claim 12, further comprising the step of forming the light emitting element, wherein the step of forming the light emitting element comprises:
forming a crystal growth layer on a substrate;
joining the crystal growth layer to a supporting substrate; and,
removing the substrate.

* * * * *